United States Patent
Kawai et al.

(10) Patent No.: US 11,127,698 B2
(45) Date of Patent: Sep. 21, 2021

(54) METHOD FOR PRODUCING CONDUCTIVE FILM, METHOD FOR PRODUCING FIELD EFFECT TRANSISTOR USING SAME, AND METHOD FOR PRODUCING WIRELESS COMMUNICATION DEVICE

(71) Applicant: TORAY INDUSTRIES, INC., Tokyo (JP)

(72) Inventors: Shota Kawai, Otsu (JP); Junji Wakita, Otsu (JP); Seiichiro Murase, Otsu (JP)

(73) Assignee: TORAY INDUSTRIES, INC., Tokyo (JP)

( * ) Notice: Subject to any disclaimer, the term of this patent is extended or adjusted under 35 U.S.C. 154(b) by 0 days.

(21) Appl. No.: 16/609,903

(22) PCT Filed: Jun. 22, 2018

(86) PCT No.: PCT/JP2018/023795
§ 371 (c)(1),
(2) Date: Oct. 31, 2019

(87) PCT Pub. No.: WO2019/009101
PCT Pub. Date: Jan. 10, 2019

(65) Prior Publication Data
US 2020/0203292 A1 Jun. 25, 2020

(30) Foreign Application Priority Data
Jul. 7, 2017 (JP) ............................. JP2017-133333

(51) Int. Cl.
*H01L 23/66* (2006.01)
*H01L 51/00* (2006.01)
(Continued)

(52) U.S. Cl.
CPC .......... *H01L 23/66* (2013.01); *H01L 51/0003* (2013.01); *H01L 51/0048* (2013.01);
(Continued)

(58) Field of Classification Search
CPC ............................. H01L 51/0045; H01L 23/66
See application file for complete search history.

(56) References Cited

U.S. PATENT DOCUMENTS

2009/0021151 A1* 1/2009 Fukuda ............... H01L 51/5265
313/504
2009/0283771 A1* 11/2009 Jiang ..................... B82Y 10/00
257/66
(Continued)

FOREIGN PATENT DOCUMENTS

CN 104521019 A 4/2015
JP 2008-285697 A 11/2008
(Continued)

OTHER PUBLICATIONS

Escobedo et al., "Infrared Irradiation: Toward Green Chemistry, a Review", International Journal of Molecular Sciencews (2016): pp. 1-26 (Year: 2016).*
(Continued)

*Primary Examiner* — Michele Fan
(74) *Attorney, Agent, or Firm* — Birch, Stewart, Kolasch & Birch, LLP

(57) ABSTRACT

The purpose of the present invention is to provide: a conductive film; a method for producing a conductive film, which enables the achievement of a conductive film or conductive pattern having good electrical conductivity by means of light irradiation of a short period of time without being accompanied by a long-time heat treatment at high temperatures; a method for producing a field effect transistor, which uses this method for producing a conductive film; and a method for producing a wireless communication device. A method for producing a conductive film according to the present invention for the achievement of the above-described purpose comprises: a step for forming a coating film by applying a conductive paste, which contains con-
(Continued)

ductive particles that have surfaces covered by elemental carbon, onto a substrate; and a step for irradiating the coating film with flashing light.

12 Claims, 6 Drawing Sheets

(51) Int. Cl.
    *H01L 51/05*     (2006.01)
    *H01Q 1/38*     (2006.01)
    *H01Q 1/22*     (2006.01)

(52) U.S. Cl.
    CPC ...... *H01L 51/0545* (2013.01); *H01L 51/0558* (2013.01); *H01Q 1/38* (2013.01); *H01L 2223/6677* (2013.01); *H01Q 1/2208* (2013.01)

(56) References Cited

U.S. PATENT DOCUMENTS

| | | | | |
|---|---|---|---|---|
| 2011/0227808 | A1* | 9/2011 | Takano | H01Q 9/285 343/906 |
| 2013/0264390 | A1* | 10/2013 | Frey | H01Q 1/2225 235/492 |
| 2014/0256081 | A1* | 9/2014 | Hammond | H01L 51/0026 438/82 |
| 2015/0221868 | A1 | 8/2015 | Wierzchowiec et al. | |
| 2015/0248058 | A1* | 9/2015 | Tanabe | G09G 5/003 345/173 |
| 2016/0328057 | A1* | 11/2016 | Chai | H01Q 1/243 |
| 2017/0038682 | A1 | 2/2017 | Suwa et al. | |
| 2017/0047558 | A1* | 2/2017 | Lee | H01L 51/56 |

FOREIGN PATENT DOCUMENTS

| | | | |
|---|---|---|---|
| JP | 2011-210972 A | 10/2011 | |
| WO | WO 2014/054530 A1 | 4/2014 | |
| WO | WO 2015/159655 A1 | 10/2015 | |
| WO | WO-2015159655 A1 * | 10/2015 | ............. G03F 7/038 |

OTHER PUBLICATIONS

International Search Report, issued in PCT/JP2018/023795, PCT/ISA/210, dated Jul. 31, 2018.
Written Opinion of the International Searching Authority, issued in PCT/JP2018/023795, PCT/ISA/237, dated Jul. 31, 2018.
Chinese Office Action for Chinese Application No. 201880043692.4, dated Sep. 23, 2020, with English translation.

* cited by examiner

[Fig 1]
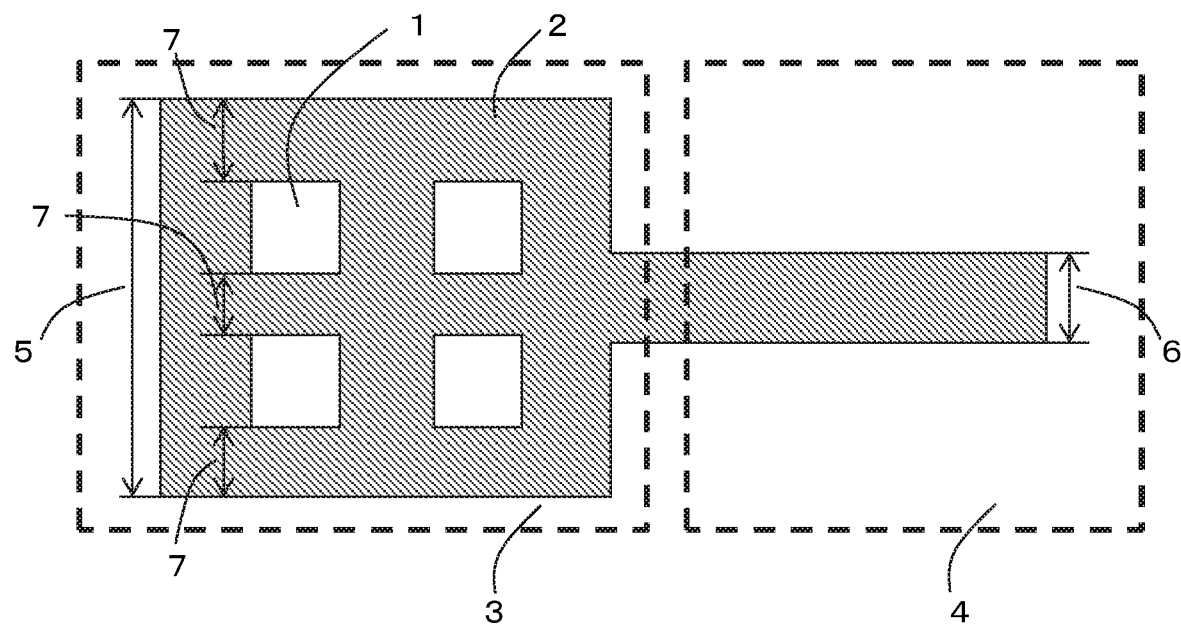
[Fig 2]
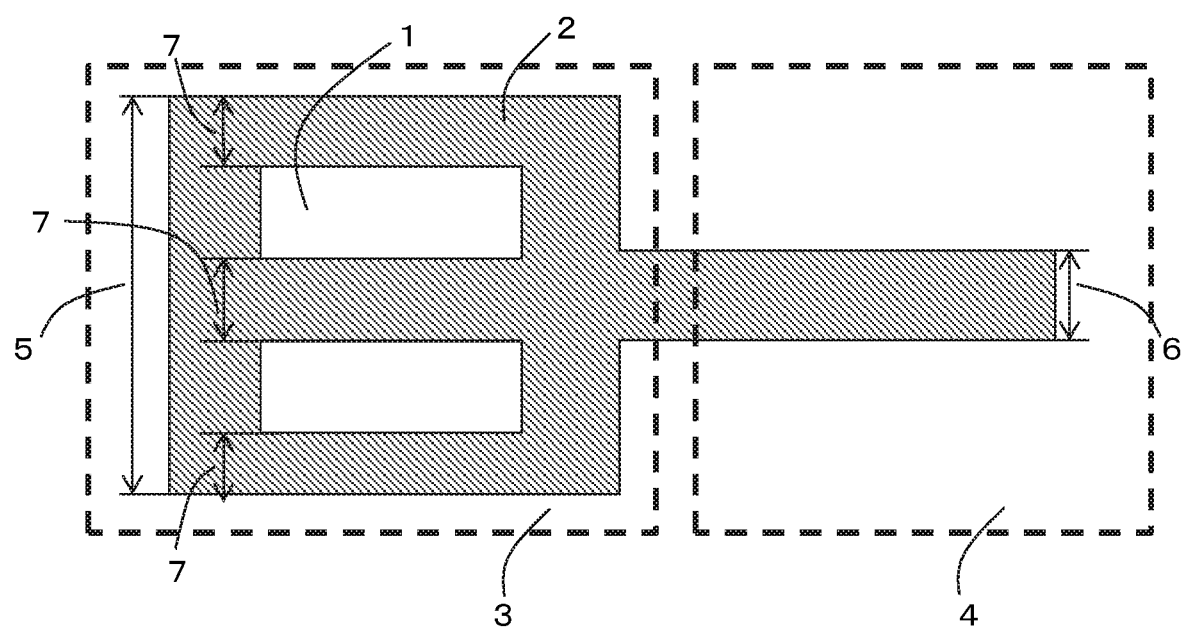

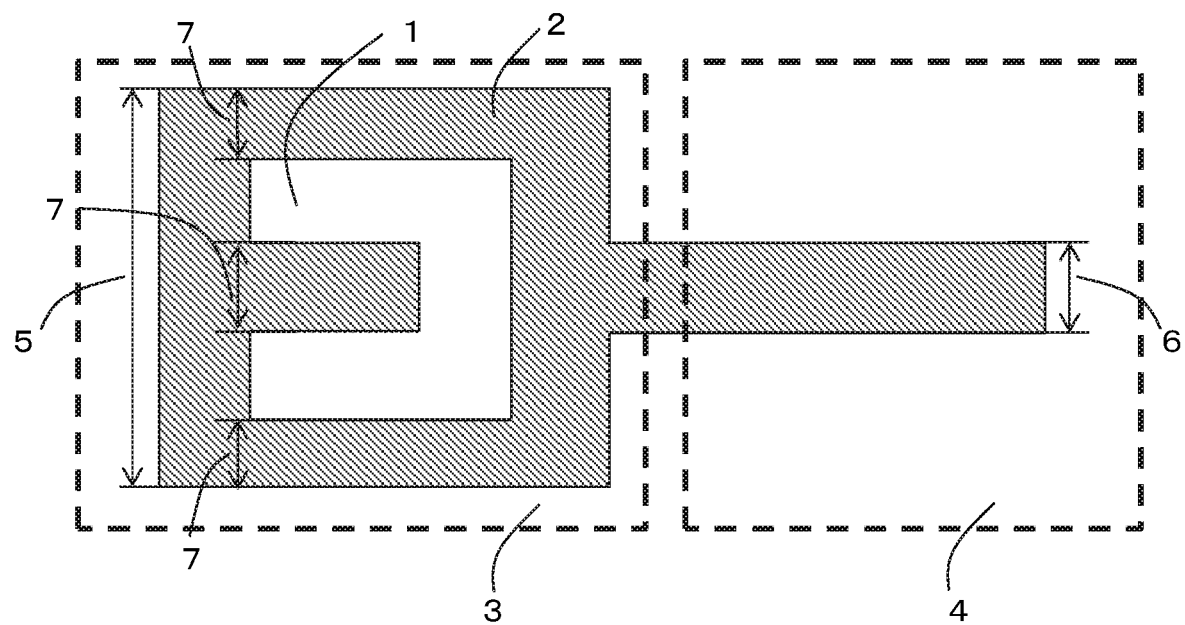

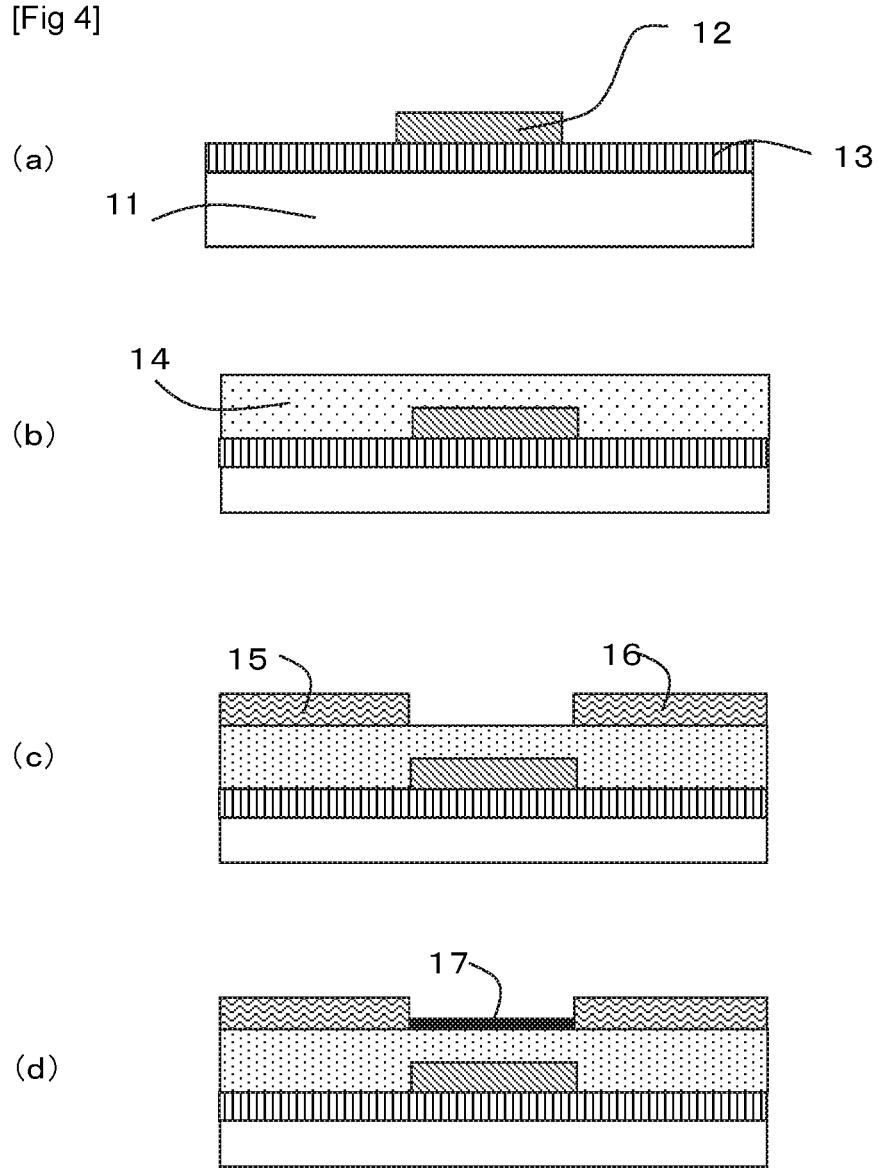

[Fig 5]
(a)
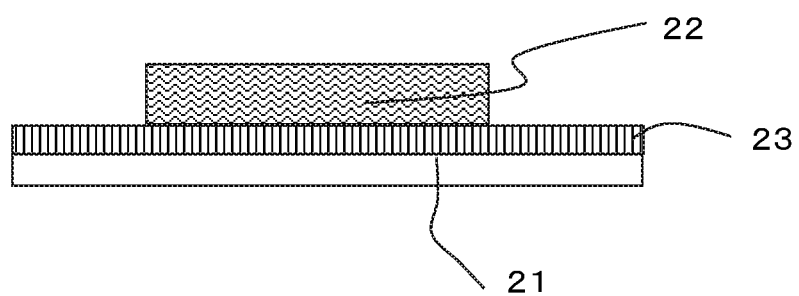
(b)
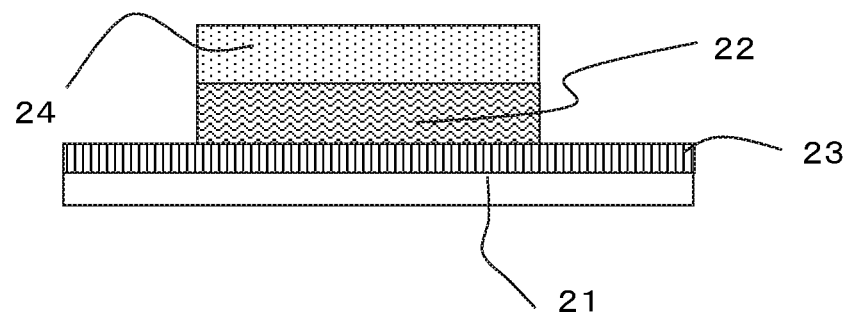
(c)
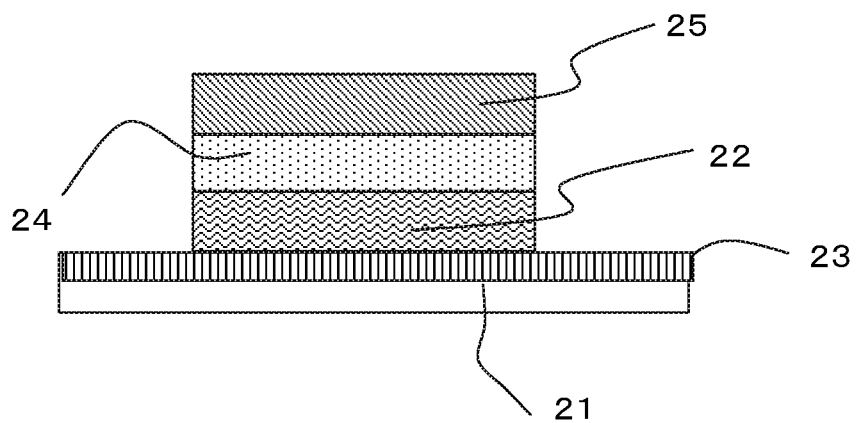

[Fig 6]
(a)
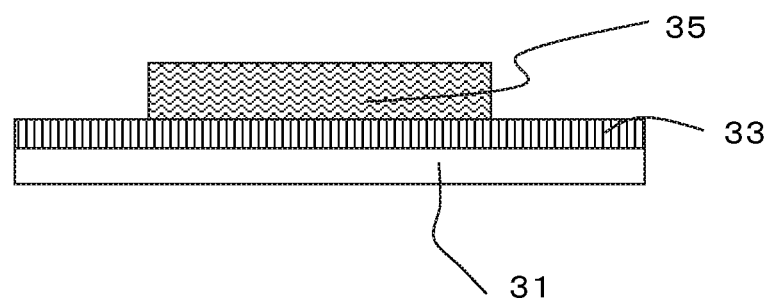
(b)
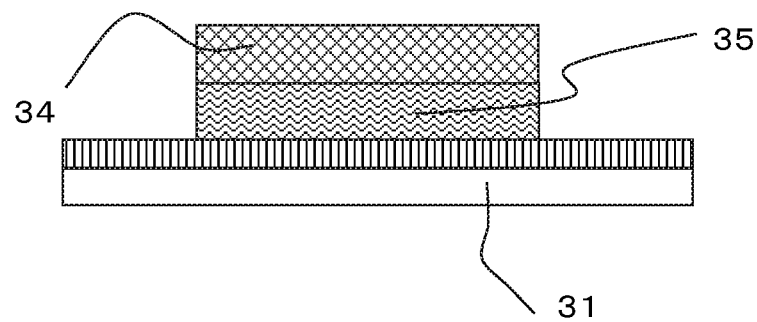
(c)
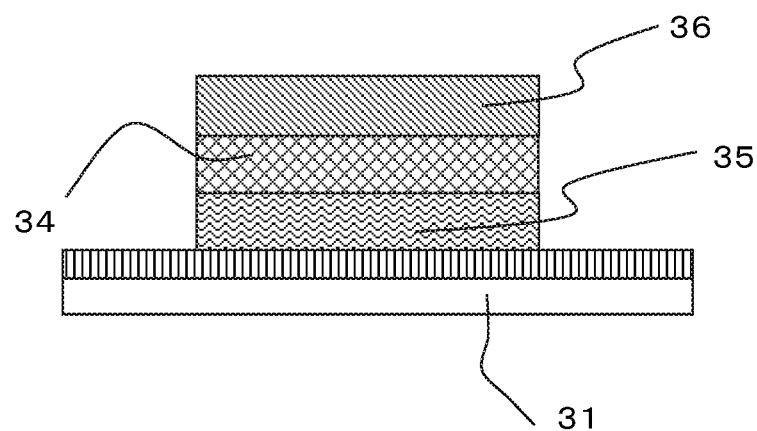

[Fig 7]
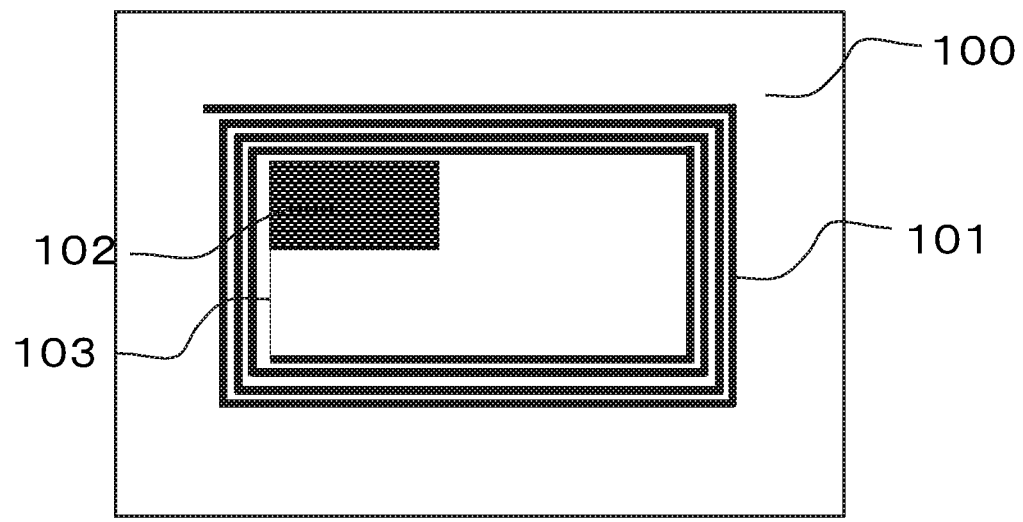
[Fig 8]
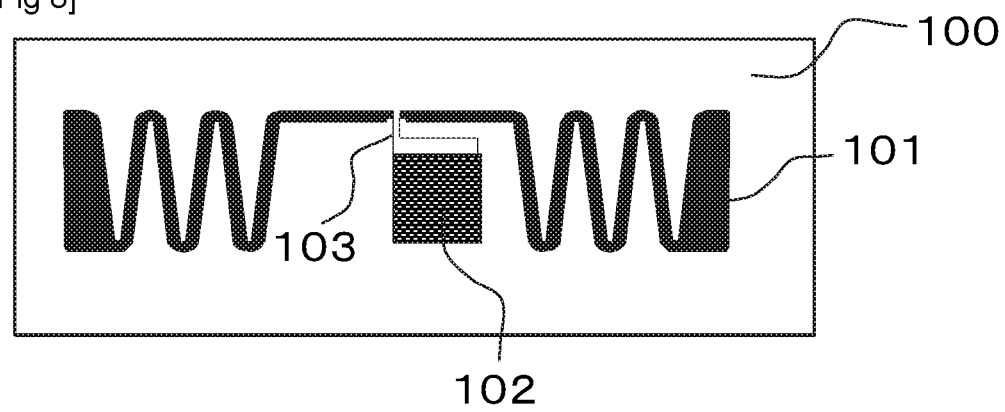

METHOD FOR PRODUCING CONDUCTIVE FILM, METHOD FOR PRODUCING FIELD EFFECT TRANSISTOR USING SAME, AND METHOD FOR PRODUCING WIRELESS COMMUNICATION DEVICE

TECHNICAL FIELD

The present invention relates to a method for producing a conductive film, a method for producing a field effect transistor using the same, and a method for producing a wireless communication device.

BACKGROUND ART

In recent years, wireless communication systems that use an RFID (Radio Frequency IDentification) technology have been advanced as non-contact tags. RFID tags are expected to be used in various applications such as logistics management, product management, and shoplifting prevention, and the introduction of the tags has been started for IC cards such as transport cards, product tags, and the like.

In an RFID system, wireless communication is performed between a wireless transceiver called a reader/writer and an RFID tag. Therefore, the RFID tag has an IC chip and an antenna for wireless communication with the reader/writer, and the antenna installed in the tag receives carrier waves transmitted from the reader/writer, and the tag operates.

RFID tags are expected to be used for various products, and cost reduction is required. For this reason, cost reduction has been studied by breaking away from the manufacturing processes that use vacuum or high temperatures and manufacturing on a flexible base material using coating/printing technique.

As a method of forming a conductive pattern on a circuit board, after applying a paste in which conductive particles are dispersed in a resin, a method of heating and bringing the conductive particles into contact with each other to develop conductivity is known (Patent Document 1). Further, as a method other than heating, a method of developing conductivity by irradiating light is also known (Patent Document 2).

PRIOR ART DOCUMENT

Patent Documents

Patent Document 1: Japanese Patent Application No. 2009-286095
Patent Document 2: Japanese Patent Laid-open Publication No. 2015-124416

SUMMARY OF THE INVENTION

Problems to be Solved by the Invention

However, in the method of producing a conductive pattern described in Patent Document 1, it is necessary to perform heat treatment for bringing conductive particles into contact with each other to develop conductivity at a high temperature for a long time, and the production efficiency when this has been applied to actual production has been extremely low.

Further, in the method of producing a conductive pattern described in Patent Document 2, in the light irradiation treatment, a part of metal particles used as the conductive particles has been fused at a stage of pre-baking a coating film, so that it has become easy to reflect irradiation light, and more energy has been required for the reflected amount than the energy required for actual conductivity development. Therefore, there has been a high possibility that a member such as a substrate is irradiated with energy more than necessary and the substrate is deteriorated, and there has been a demand for a production method for obtaining a conductive pattern while avoiding these problems.

Therefore, an object of the present invention is to provide a method for producing a conductive film that can obtain a conductive film having good conductivity or a conductive pattern by light irradiation for a short time without accompanying high-temperature and long-time heat treatment. In the present invention, the conductive pattern represents a conductive film formed in a pattern.

Also, an object of the present invention is to provide a method for producing a field effect transistor using the method for producing a conductive film of the present invention, and a method for producing a wireless communication device.

Solutions to the Problems

In order to solve the problems, the method for producing a conductive film of the present invention includes steps of: applying a conductive paste containing conductive particles surface-coated with a carbon simple substance and a photosensitive organic component onto a substrate to form a coating film; and irradiating the coating film with flash light.

Effects of the Invention

According to the method for producing a conductive film of the present invention, a conductive film having good conductivity can be obtained by light irradiation for a short time without accompanying high-temperature and long-time heat treatment.

Further, according to the method for producing a field effect transistor or method for producing a wireless communication device of the present invention, a field effect transistor or wireless communication device using the method for producing a conductive film of the present invention can be obtained.

BRIEF DESCRIPTION OF THE DRAWINGS

FIG. 1 is a schematic diagram showing an example of a form of a conductive film of the present invention.
FIG. 2 is a schematic diagram showing an example of the form of the conductive film of the present invention.
FIG. 3 is a schematic diagram showing an example of the form of the conductive film of the present invention.
FIG. 4 is a schematic cross-sectional view showing an embodiment of a method for producing a field effect transistor of the present invention.
FIG. 5 is a schematic cross-sectional view showing an example of a method for producing a ferroelectric memory element using the conductive film obtained by the method for producing a conductive film of the present invention.
FIG. 6 is a schematic cross-sectional view showing an example of a method for producing a capacitor using the conductive film obtained by the method for producing a conductive film of the present invention.
FIG. 7 is a schematic diagram of a wireless communication device formed by the method for producing a wireless communication device of the present invention.

FIG. 8 is a schematic diagram of a wireless communication device formed by the method for producing a wireless communication device of the present invention.

EMBODIMENTS OF THE INVENTION

Hereinafter, embodiments for carrying out the present invention will be described in detail. It is to be noted that the present invention is not limited by the following embodiment.

The method for producing a conductive film of the present invention includes steps of: applying a conductive paste containing conductive particles surface-coated with a carbon simple substance and a photosensitive organic component onto a substrate to form a coating film; and irradiating the coating film with flash light. The coating film in the present invention also includes a film coated in a desired pattern in the step of applying a conductive paste.

Moreover, it is preferred that the method for producing a conductive film of the present invention further includes a step of exposing and developing the coating film. That is, a preferred embodiment of the method for producing a conductive film of the present invention includes steps of: applying a conductive paste containing conductive particles surface-coated with a carbon simple substance and a photosensitive organic component onto a substrate to form a coating film; exposing and developing the coating film to form a pattern; and irradiating the coating film with flash light.

(Substrate)

The substrate may be made of any material as long as at least a surface on which the conductive paste is applied is insulative. For example, inorganic materials such as silicon wafer, glass, sapphire and sintered alumina, organic materials such as polyimide, polyvinyl alcohol, polyvinyl chloride, polyethylene terephthalate (hereinafter sometimes referred to as PET), polyvinylidene fluoride, polysiloxane, polyvinylphenol (hereinafter, sometimes referred to as PVP), polyester, polycarbonate, polysulfone, polyethersulfone, polyethylene, polyphenylene sulfide, and polyparaxylene and the like are preferably used.

Since the method for producing a conductive film of the present invention does not involve high-temperature and long-time heat treatment, it can be also applied onto a substrate having low heat resistance.

(Undercoat Layer)

In the method for producing a conductive film of the present invention, it is preferred that the substrate has an undercoat layer. Moreover, the undercoat layer preferably contains at least one of an acrylic resin and a siloxane-based resin. This makes it easier to control a pattern shape when the conductive paste is formed in a pattern on the substrate to improve adhesion to the substrate, and makes it easier to suppress peeling of the coating film when the coating film is irradiated with flash light.

The acrylic resin refers to a resin containing at least a structure derived from an acrylic monomer in a repeating unit. As specific examples of the acrylic monomer, all compounds having a (meth)acryloyl group in the molecule can be used, but preferably include, acrylic monomers such as acrylic acid, methyl acrylate, 2-ethylhexyl acrylate, ethyl methacrylate, n-butyl acrylate, i-butyl acrylate, i-propyl acrylate, glycidyl acrylate, N-methoxymethylacrylamide, N-ethoxymethylacrylamide, N-n-butoxymethylacrylamide, N-isobutoxymethylacrylamide, butoxytriethylene glycol acrylate, dicyclopentanyl acrylate, dicyclopentenyl acrylate, 2-hydroxyethyl acrylate, isobornyl acrylate, 2-hydroxypropyl acrylate, isodecyl acrylate, isooctyl acrylate, lauryl acrylate, 2-methoxyethyl acrylate, methoxy ethylene glycol acrylate, methoxy diethylene glycol acrylate, octafluoropentyl acrylate, stearyl acrylate, trifluoroethyl acrylate, acrylamide, aminoethyl acrylate, phenyl acrylate, phenoxyethyl acrylate, 1-naphthyl acrylate, 2-naphthyl acrylate, thiophenol acrylate, and benzyl mercaptan acrylate, and those with acrylates thereof replaced with various methacrylates. These acrylic monomers may be used alone or two or more thereof.

The siloxane-based resin refers to a compound having a structure obtained by polycondensing a silane compound. The silane compound is not particularly limited, but diethoxydimethylsilane, diethoxydiphenylsilane, tetramethoxysilane, tetraethoxysilane, vinyltrimethoxysilane, methyltrimethoxysilane, ethyltrimethoxysilane, propyltrimethoxysilane, hexyltrimethoxysilane, octadecyltrimethoxysilane, phenyltrimethoxysilane, p-tolyltrimethoxysilane, benzyltrimethoxysilane, α-naphthyltrimethoxysilane, β-naphthyltrimethoxysilane, trifluoroethyltrimethoxysilane, trimethoxysilane, γ-methacryloxypropyltrimethoxysilane or the like can be used. These silane compounds may be used alone or two or more thereof.

(Conductive Particles)

Examples of the conductive particles contained in the conductive paste used in the present invention include gold (Au), silver (Ag), copper (Cu), nickel (Ni), tin (Sn), bismuth (Bi), lead (Pb), zinc (Zn), palladium (Pd), platinum (Pt), aluminum (Al), tungsten (W), molybdenum (Mo), carbon (C) and the like. Among them, conductive particles containing at least one element selected from the group consisting of gold, silver, copper, nickel, tin, bismuth, lead, zinc, palladium, platinum, aluminum, and carbon are preferable.

In the method for producing a conductive film of the present invention, it is more preferred that the conductive particles are silver particles. When the conductive particles are silver particles, a conductive film and a conductive pattern that are excellent in conductivity and stability are easily obtained.

In the method for producing a conductive film of the present invention, an average particle diameter of the conductive particles is preferably 10 to 200 nm. The average particle diameter is more preferably 10 to 60 nm. By setting the average particle diameter within such a range, a fine conductive pattern having desired conductivity is easily formed. Here, the average particle diameter of the conductive particles is calculated by an arithmetic average value of particle diameters of 100 primary particles randomly selected using a scanning electron microscope. The particle diameter of each primary particle is calculated based on the arithmetic average value obtained by measuring a major axis and a minor axis of the primary particle.

(Carbon Simple Substance)

In the method for producing a conductive film of the present invention, the conductive particles are surface-coated with a carbon simple substance. In the coating film, a carbon weight ratio of the carbon simple substance is preferably 0.5% to 20% by weight ratio to the conductive particles. By setting the weight ratio within this range, an energy absorption efficiency when irradiated with flash light is increased, and further, the carbon simple substance is decomposed and vaporized by the flash light, and the conductive particles are easily contacted and fused. The carbon weight ratio of the carbon simple substance to the conductive particles is calculated by measuring mass reduction of the carbon simple substance and the conductive particles by a thermobalance, assuming that the reduction value is all due to combustion of carbon and the reduced mass is that of the conductive particles. The carbon weight ratio in the present invention is a ratio of the carbon simple substance to the conductive particles in the coating film of the conductive paste, but it is preferred that the carbon weight ratio is also the same in the conductive paste. By coating the surface of the conductive particles with the carbon simple substance, it is possible to suppress fusion between the conductive particles at a low temperature, and further to make the energy absorption efficiency when irradiated with flash light more uniform.

Examples of the method for coating the surface of the conductive particles with the carbon simple substance include a method in which conductive particles are contacted with a reactive gas when preparing conductive particles by a thermal plasma method (Japanese Patent Laid-Open No. 2007-138287). The surface of the conductive particles is preferably completely covered. However, as long as this object is achieved, the presence of conductive particles partially incompletely covered is allowed. Also, the carbon simple substance covering the conductive particles is preferably a complete carbon simple substance. Furthermore, as long as this object is achieved, the material covering the conductive particles may contain a hydrocarbon, or may contain a carbon simple substance, a part of which is oxidized or substituted with a functional group, in addition to the carbon simple substance. In the present invention, the term "surface-coated" means that a coating film layer is formed on the surface of the conductive particles. Formation of the coating film layer can be confirmed using a transmission electron microscope. A fact that the surface coated substance is composed of a carbon simple substance is usually confirmed by a Raman spectrum measurement method, but when it cannot be measured, it is confirmed by an electron energy loss spectroscopy. In the case of the Raman spectrum measurement method, 300 mg of surface-coated conductive particles are extracted with 3 g of N-methylpyrrolidone, immersed in a bath-type ultrasonic cleaner (manufactured by AS ONE Corporation, 38 kHz) at room temperature for 30 minutes, and it is confirmed by that the Raman spectrum when the extract is measured at an excitation wavelength of 532 nm has signals near 1330 cm$^{-1}$ and near 1580 cm$^{-1}$. Moreover, in the case of electron energy loss spectroscopy, a surface coating layer is directly measured, and it is confirmed by having signals near 285 eV and near 290 eV, respectively.

In the method for producing a conductive film of the present invention, an average thickness of a surface coating layer of the conductive particles surface-coated with a carbon simple substance is preferably 0.1 to 10 nm. By making the average thickness within this range, it becomes easy to improve fine pattern processability by suppressing the fusion among the conductive particles, and desired conductivity can be made easily developed by irradiating with flash light.

As to the average thickness of the surface coating layer, mass reduction of the conductive particles surface-coated with a carbon simple substance is measured by a thermobalance, and assuming that the value is all due to combustion of carbon, the average thickness of the surface coating layer is calculated from the particle diameter with a density of carbon of 2.0 (g/cm$^3$). It is assumed that carbon is coated with an average thickness A (μm) on conductive particles whose average particle diameter Dp (μm) is known. The number of particles coated with carbon is defined as n. Assuming that the mass weighed first in the thermobalance measurement is W1 (g), the mass where carbon is completely blown is W2 (g) and the density of the conductive particles is ρ (g/cm$^3$), n can be calculated when Dp and W2 are known from the following equation.

$$W2 = \Pi/6 \times Dp^3 \rho \times n$$

Then, the average thickness A of a surface coating layer is calculated by the following equation.

$$W1 - W2 = \{4/3 \times \Pi (Dp/2 + A)^3 - \Pi/6 \times Dp^3\} \times 2.0 \times n$$

The content of the conductive particles with respect to the total solid content in the conductive paste is preferably 65 to 95% by mass, more preferably 70 to 95% by mass, and further preferably 70 to 90% by mass. By containing the conductive particles within the ranges, it becomes easy to make pattern processability and conductivity development compatible. Here, the total solid content refers to all components excluding the solvent among the components contained in the conductive paste.

(Photosensitive Organic Component)

In the method for producing a conductive film of the present invention, the conductive paste further contains a photosensitive organic component. By containing a photosensitive organic component, it is possible to form a pattern by exposure and development.

The photosensitive organic component preferably contains a monomer, an oligomer or a polymer having a polymerizable unsaturated group in the molecule.

As the monomer having a polymerizable unsaturated group in the molecule, a compound having a carbon-carbon double bond can be used. Monofunctional and polyfunctional compounds having a vinyl group, an allyl group, an acrylate group, a methacrylate group, or an acrylamide group as the functional group can be applied to such monomers. Specific examples thereof include allylated cyclohexyl diacrylate, polyethylene glycol diacrylate, dipentaerythritol hexaacrylate, dipentaerythritol monohydroxypentaacrylate, ditrimethylolpropane tetraacrylate, glycerol diacrylate, methoxylated cyclohexyl diacrylate, neopentyl glycol diacrylate, propylene glycol diacrylate, polypropylene glycol diacrylate, triglycerol diacrylate, trimethylolpropane triacrylate, bisphenol A diacrylate, diacrylates of bisphenol A-ethylene oxide adducts, diacrylates of bisphenol A-propylene oxide adducts, 1,6-hexanediol diacrylate, tripropylene glycol diacrylate, 2-(2-ethoxyethoxy)ethyl acrylate, tetrahydrofurfuryl acrylate, lauryl acrylate, 2-phenoxyethyl acrylate, isodecyl acrylate, isooctyl acrylate, tridecyl acrylate, 1,3-butanediol diacrylate, 1,4-butanediol diacrylate, diethylene glycol diacrylate, tetraethylene glycol diacrylate, triethylene glycol diacrylate, compounds obtained by partially or entirely replacing the acrylic groups of the compounds mentioned above for methacrylic group, and the like.

In the present invention, one or two or more of them can be used. The monomer is added in the range of 1 to 15% by mass, and more preferably in the range of 2 to 10% by mass with respect to the total solid content in the conductive paste. When the monomer content is 1% by mass or more, sufficient sensitivity is easily obtained, and good pattern is easily formed. On the other hand, when the monomer content is 15% by mass or less, the dry film is less likely to be tacked, a photomask is less likely to come into contact at the time of exposure, and a problem that the photomask gets dirty or a surface of a coating film is disturbed is less likely to occur.

In order to obtain an oligomer or polymer having a polymerizable unsaturated group in the molecule, an oligomer or polymer is first obtained by polymerizing or copolymerizing a component selected from a compound having a carbon-carbon double bond. Next, an oligomer or polymer having a polymerizable unsaturated group in the molecule can be obtained by reacting a compound having a polymerizable unsaturated group with such an oligomer or polymer, at the side chain or molecular end.

Preferred polymerizable unsaturated groups are those containing in the structure an ethylenically unsaturated group, that is, a group having a carbon-carbon double bond. Examples of the ethylenically unsaturated group include a vinyl group, an allyl group, an acrylic group, a methacrylic group, and the like.

Examples of the method of reacting the compound having a polymerizable unsaturated group with an oligomer or a polymer include a method of causing a reaction of an ethylenically unsaturated compound having a glycidyl group or an isocyanate group, an acrylic acid chloride, a methacrylic acid chloride or an allyl chloride as a compound having a polymerizable unsaturated group, with respect to a mercapto group, an amino group, a hydroxyl group, or a carboxyl group in the side chain or molecular end of the oligomer or polymer.

Examples of the ethylenically unsaturated compound having a glycidyl group include glycidyl acrylate, glycidyl methacrylate, allyl glycidyl ether, glycidyl ethyl acrylate, crotonyl glycidyl ether, crotonic acid glycidyl ether, isocrotonic acid glycidyl ether, and the like.

Examples of the ethylenically unsaturated compound having an isocyanate group include (meth)acryloyl isocyanate, (meth)acryloylethyl isocyanate, and the like.

The ethylenically unsaturated compound having a glycidyl group or an isocyanate group, an acrylic acid chloride, a methacrylic acid chloride or an allyl chloride is preferably added to be equivalent to 0.05 to 1 mol, with respect to a mercapto group, an amino group, a hydroxyl group or a carboxyl group in the oligomer or polymer.

The photosensitive organic component is preferably an alkali-soluble resin. The alkali-soluble resin is generally obtained by copolymerizing a compound containing a carboxyl group and another monomer. The alkali-soluble resin is preferably a (meth)acrylic copolymer. Here, the (meth) acrylic copolymer refers to a copolymer containing at least a (meth)acrylic monomer in a copolymerization component. Here, examples of the (meth)acrylic monomer include methyl (meth)acrylate, ethyl (meth)acrylate, n-propyl (meth)acrylate, isopropyl (meth)acrylate, n-butyl (meth) acrylate, sec-butyl (meth)acrylate, isobutyl (meth)acrylate, tert-butyl (meth)acrylate, n-pentyl (meth)acrylate, allyl (meth)acrylate, benzyl (meth)acrylate, butoxyethyl (meth) acrylate, butoxytriethylene glycol (meth)acrylate, cyclohexyl (meth)acrylate, dicyclopentanyl (meth)acrylate, dicyclopentenyl (meth)acrylate, 2-ethylhexyl (meth)acrylate, glycerol (meth)acrylate, glycidyl (meth)acrylate, heptadecafluorodecyl (meth)acrylate, 2-hydroxyethyl (meth)acrylate, isbornyl (meth)acrylate, 2-hydroxypropyl (meth)acrylate, isodecyl (meth)acrylate, isooctyl (meth)acrylate, lauryl (meth)acrylate, 2-methoxyethyl (meth)acrylate, methoxy ethylene glycol (meth)acrylate, methoxydiethylene glycol (meth)acrylate, octafluoropentyl (meth)acrylate, phenoxyethyl (meth)acrylate, stearyl (meth)acrylate, trifluoroethyl (meth)acrylate, (meth)acrylamide, aminoethyl (meth)acrylate, phenyl (meth)acrylate, 1-naphthyl (meth)acrylate, 2-naphthyl (meth)acrylate, thiophenol (meth)acrylate, and benzyl mercaptan (meth)acrylate.

As the copolymer component other than the (meth)acrylic monomer, a compound having a carbon-carbon double bond can be used. Examples of such compounds include aromatic vinyl compounds such as styrene, p-methylstyrene, o-methylstyrene, m-methylstyrene, and α-methylstyrene, amide unsaturated compounds such as (meth)acrylamide, N-methylol (meth)acrylamide, and N-vinylpyrrolidone, (meth)acrylonitrile, allyl alcohol, vinyl acetate, cyclohexyl vinyl ether, n-propyl vinyl ether, i-propyl vinyl ether, n-butyl vinyl ether, i-butyl vinyl ether, 2-hydroxyethyl vinyl ether, and 4-hydroxybutyl vinyl ether.

Examples of a compound containing a carboxyl group which is a copolymer component that imparts alkali solubility to the alkali-soluble resin include (meth)acrylic acid, itaconic acid, crotonic acid, maleic acid, fumaric acid, and acid anhydrides thereof.

When using a (meth)acrylic copolymer, it is preferable to use a (meth)acrylic copolymer having a carbon-carbon double bond in the side chain or molecular end, in order to increase the rate of the curing reaction by exposure of the photosensitive organic component. Examples of the functional group having a carbon-carbon double bond include a vinyl group, an allyl group, and a (meth)acrylic group. In order to add such a functional group to the (meth)acrylic copolymer, there is a method of addition reaction of a glycidyl group or an isocyanate group, and a compound having a carbon-carbon double bond or (meth)acrylic acid chloride or allyl chloride, with respect to the mercapto group, amino group, hydroxyl group or carboxyl group in the (meth)acrylic copolymer.

Examples of the compound having a glycidyl group and a carbon-carbon double bond include glycidyl (meth)acrylate, allyl glycidyl ether or glycidyl ethyl acrylate, crotonyl glycidyl ether, glycidyl crotonate, and glycidyl isocrotonate. Examples of the compound having an isocyanate group and a carbon-carbon double bond include (meth)acryloyl isocyanate and (meth)acryloyloxyethyl isocyanate.

The alkali-soluble resin is preferably an alkali-soluble resin having an acid dissociable group. The alkali-soluble resin having an acid dissociable group is generally obtained by copolymerizing a compound containing a carboxyl group and a compound having an acid dissociable group. More specific examples include copolymerization of a (meth) acrylic acid compound containing a carboxyl group and a (meth)acrylic acid ester having an acid dissociable group.

In order for the acid dissociable group to decompose or vaporize after desorption, the acid dissociable group is preferably an organic group having 4 to 15 carbon atoms, and more preferably an organic group having 6 to 15 carbon atoms. When the acid dissociable group has less than 4 carbon atoms, it will vaporize at a low temperature after desorption, which may cause large bubbles in the film, preventing contact between the conductive particles and deteriorating the conductivity. On the other hand, when the acid dissociable group has more than 15 carbon atoms, the dissociable group may remain in the film after desorption, preventing the contact between the conductive particles, and also deteriorating the conductivity. In addition, in a case where the acid dissociable group is an organic group having 6 to 15 carbon atoms, even when bubbles are generated in the film, the bubbles can be easily eliminated by postbaking, and a conductive pattern having good conductivity can be formed.

Examples of the acid dissociable group include a tertbutyl group, a tert-butoxycarbonyl group, a benzyl group, a methyladamantyl group, and a tetrahydropyranyl group.

Examples of the (meth)acrylic acid ester having an acid dissociable group include 1-methyladamantyl (meth)acrylate, tert-butyl (meth)acrylate, benzyl (meth)acrylate, and tetrahydropyranyl (meth)acrylate.

In the conductive paste used in the present invention, the content of the alkali-soluble resin is preferably within the range of 5 to 30% by mass with respect to the total solid content in consideration of development of photosensitivity.

The alkali-soluble resin is preferably an alkali-soluble resin obtained by radical copolymerization of a compound having an acid dissociable group by 20 to 80% by mol. In particular, the (meth)acrylic acid ester having an acid dissociable group is preferably contained in the alkali-soluble resin as a monomer component in an amount of 20 to 80% by mol. By using such an alkali-soluble resin having an acid-dissociable group, the acid dissociable group is easily thermally oxidatively decomposed and desorbed at 100 to 300° C. under air, and the film is greatly shrunk so that the concentration of the conductive particles in the total solid content can be easily increased. As a result, it becomes easy to obtain conductivity. In this case, when a photoacid generator and/or a thermal acid generator described later is used in combination, the effect becomes further remarkable.

The carboxylic acid equivalent of the alkali-soluble resin is preferably 200 to 1,400 g/mol, and more preferably 400 to 1,000 g/mol. The carboxylic acid equivalent of the acrylic resin can be calculated by measuring the acid value. Further, the double bond equivalent of the alkali-soluble resin is preferably 150 to 10,000 g/mol because both hardness and crack resistance can be achieved at a high level. The double bond equivalent of the acrylic resin can be calculated by measuring the iodine value.

The weight average molecular weight (Mw) of the alkali-soluble resin is preferably 1,000 to 100,000 in terms of polystyrene measured by gel permeation chromatography (GPC). By setting the weight average molecular weight (Mw) within the above range, good coating characteristics can be obtained, and solubility in a developing solution during pattern formation is also good.

(Dispersant)

The conductive paste used for the method for producing a conductive film of the present invention may contain a dispersant. By containing the dispersant, the conductive particles can be stably present in the conductive paste.

The dispersant is preferably an amine-based one. Examples of the commercially available amine-based dispersants include DISPERBYK (registered trademark) 106, 108, 112, 116, 142, 145, 166, 180, 2001, 2008, 2022, 2150, 6919 and 21116 (all of which are manufactured by BYK Japan KK) and Efka (registered trademark) 4300, 4400, 4401, 4403, 4406, 4510, 4570, 4800, 5054, 5055 and 5207 (all of which are manufactured by BASF SE).

In order to further improve dispersibility, the dispersant preferably has an acrylic block copolymer structure. Examples of commercially available amine-based dispersants having an acrylic block copolymer structure include DISPERBYK (registered trademark) 2001, 2008, 2022, 2150, 6919 and 21116, and Efka (registered trademark) 4300.

(Photopolymerization Initiator)

The conductive paste used in the method for producing a conductive film of the present invention may contain a photopolymerization initiator. By containing a photopolymerization initiator, negative photosensitivity can be imparted to the conductive paste.

Examples of the photopolymerization initiator include acetophenone-based compounds, benzophenone-based compounds, benzoin ether-based compounds, α-aminoalkylphenone-based compounds, thioxanthone-based compounds, organic peroxides, imidazole-based compounds, titanocene-based compounds, triazine-based compounds, acylphosphine oxide compounds, quinone compounds, and oxime ester-based compounds. Among them, an oxime ester-based compound having high sensitivity even when added in a small amount is preferable, and an oxime ester-based compound having a carbazole skeleton is more preferable. Examples of the oxime ester-based compound having no carbazole skeleton include Irgacure (registered trademark) OXE01 (manufactured by BASF SE). Moreover, examples of the oxime ester-based compound having a carbazole skeleton include Irgacure (registered trademark) OXE02 (manufactured by BASF SE), ADEKA OPTOMER (registered trademark) N1919 (manufactured by ADEKA CORPORATION) and ADEKA ARKLS (registered trademark) NCI-831 (manufactured by ADEKA CORPORATION).

(Solvent)

The conductive paste used in the method for producing a conductive film of the present invention may contain a solvent.

Examples of the solvent include propylene glycol monomethyl ether, propylene glycol monobutyl ether, 2-heptanol, cyclohexanol, cyclopentanol, 2-butanol, 2-pentanol, t-butanol, diacetone alcohol, α-terpineol, 2-methyl hydroxyisobutyrate, ethyl 2-hydroxyisobutyrate, propylene glycol monoethyl ether acetate, ethyl acetoacetate, methyl acetoacetate, methyl-3-methoxypropionate, 3-methyl-3-methoxybutyl acetate, cyclopentanone, cyclohexanone, benzyl ethyl ether, dihexyl ether, acetonyl acetone, isophorone, benzyl acetate, ethyl benzoate, diethyl oxalate, diethyl maleate, ethylene carbonate, propylene carbonate, methyl benzoate, ethyl benzoate, diethyl malonate, β-propiolactone, γ-butyrolactone, γ-valerolactone, δ-valerolactone, γ-caprolactone, ε-caprolactone, ethylene glycol monobutyl ether acetate, diethylene glycol monoethyl ether acetate, diethylene glycol monobutyl ether acetate, diethylene glycol dimethyl ether, diethylene glycol diethyl ether, diethylene glycol methyl ethyl ether, dipropylene glycol methyl ether acetate, dipropylene glycol dimethyl ether, propylene glycol diacetate, 1,3-butylene glycol diacetate, cyclohexanol acetate, dimethyl sulfoxide, methyl ethyl ketone, isobutyl acetate, butyl acetate, propyl acetate, isopropyl acetate, acetylacetone, triacetin, and 2-heptanone.

(Other Particles)

The conductive paste used in the method for producing a conductive film of the present invention may contain particles other than the conductive particles surface-coated with a carbon simple substance for improving dispersibility and controlling conductivity. Examples of other particles include metal particles or metal oxide particles that are not surface-coated, organic pigments, and inorganic pigments.

The average particle diameter of these other particles is preferably 10 to 100 nm. When the average particle diameter is 10 nm or more, it is easy to reduce the amount of the dispersant used for dispersion stabilization, and it is easy to obtain desired conductivity. On the other hand, when the average particle diameter is 100 nm or less, it is easy to form a fine pattern. Here, the average particle diameter of the other particles is calculated by an arithmetic average value of particle diameters of 100 primary particles randomly selected using a scanning electron microscope. The particle diameter of each primary particle is calculated based on the arithmetic average value obtained by measuring a major axis and a minor axis of the primary particle.

As these other particles, carbon black that contributes to conductivity control is preferable.

Examples of the carbon black include MA77, 7, 8, 11, 100, 100R, 100S, 230, 220 and 14 (all of which are manufactured by Mitsubishi Chemical Corporation), #52, 47, 45, 45L, 44, 40, 33, 32, 30, 25, 20, 10, 5, 95, 85 and 260 (all of which are manufactured by Mitsubishi Chemical Corporation), Special Black 100, 250, 350 and 550 (all are manufactured by Evonik Corporation), and Printex 95, 90, 55, 45, 40, P, 60, L6, L, 300, 30, ES23, 9, ES22, 35, A and G (all of which are manufactured by Evonik Corporation). Among them, MA77, 7, 8, 11, 100, 100R, 100S, 230, 220 or 14 or Special Black 100, 250, 350 or 550 having a pH value of 4 or less is preferable. The pH value of carbon black can be measured according to JIS K5101.

(Photoacid Generator and Thermal Acid Generator)

The conductive paste used in the method for producing a conductive film of the present invention may contain a photoacid generator and/or a thermal acid generator. When the conductive paste further contains a photosensitive organic component, the photosensitive organic component is an alkali-soluble resin, and the alkali-soluble resin is an alkali-soluble resin having an acid dissociable group, decomposition of the acid dissociable group is promoted by generated acid, and the heat treatment temperature under air can be lowered.

Examples of the thermal acid generator which is a compound that generates an acid by heat include SI-60, SI-80, SI-100, SI-110, SI-145, SI-150, SI-60L, SI-80L, SI-100L, SI-110L, SI-145L, SI-150L, SI-160L, SI-180L and SI-200 (all of which are manufactured by SANSHIN CHEMICAL INDUSTRY CO., LTD.), 4-hydroxyphenyldimethylsulfonium, benzyl-4-hydroxyphenylmethylsulfonium, 2-methylbenzyl-4-hydroxyphenylmethylsulfonium, 2-methylbenzyl-4-acetylphenylmethylsulfonium, 2-methylbenzyl-4-benzoyloxyphenylmethylsulfonium and methanesulfonates thereof, trifluoromethanesulfonates, camphorsulfonates and p-toluenesulfonates. Among them, 4-hydroxyphenyldimethylsulfonium, benzyl-4-hydroxyphenylmethylsulfonium, 2-methylbenzyl-4-hydroxyphenylmethylsulfonium, 2-methylbenzyl-4-acetylphenylmethylsulfonium, 2-methylbenzyl-4-benzoyloxyphenylmethylsulfonium or a methanesulfonate thereof, a trifluoromethanesulfonate, a camphorsulfonate or a p-toluenesulfonate can be preferably used.

The content of the thermal acid generator in the conductive paste is preferably 0.01 to 20 parts by mass with respect to 100 parts by mass of the alkali-soluble resin since the decomposition of the acid dissociable group in the alkali-soluble resin having an acid dissociable group is promoted, the contact between the conductive particles is not hindered, and higher conductivity is obtained.

The acid generated from the photoacid generator which is a compound that generates an acid by light is preferably a strong acid such as perfluoroalkylsulfonic acid or p-toluenesulfonic acid in order to promote the decomposition of the acid dissociable group.

Examples of the photoacid generator include SI-101, SI-105, SI-106, SI-109, PI-105, PI-106, PI-109, NAI-100, NAI-1002, NAI-1003, NAI-1004, NAI-101, NAI-105, NAI-106, NAI-109, NDI-101, NDI-105, NDI-106, NDI-109, PAI-01, PAI-101, PAI-106 and PAI-1001 (all of which are manufactured by Midori Kagaku Co., Ltd.), SP-077 and SP-082 (all of which are manufactured by ADEKA CORPORATION), TPS-PFBS (manufactured by Toyo Gosei Co., Ltd), CGI-MDT and CGI-NIT (all of which are manufactured by Ciba Japan K.K.) and WPAG-281, WPAG-336, WPAG-339, WPAG-342, WPAG-344, WPAG-350, WPAG-370, WPAG-372, WPAG-449 WPAG-469, WPAG-505 and WPAG-506 (all of which are manufactured by Wako Pure Chemical Industries, Ltd.).

The content of the photoacid generator in the conductive paste is preferably 0.01 to 20 parts by mass with respect to 100 parts by mass of the alkali-soluble resin since the decomposition of the acid dissociable group in the alkali-soluble resin having an acid dissociable group is promoted, the contact between the conductive particles is not hindered, and higher conductivity is obtained.

Moreover, in order to further promote the decomposition of the acid dissociable group, a thermal acid generator and a photoacid generator may be used in combination.

(Sensitizer)

When the conductive paste used in the method for producing a conductive film of the present invention contains a photoacid generator, the conductive paste may further contain a sensitizer. The sensitizer is preferably vaporized by heat treatment or discolored by light irradiation even when it remains in a cured film, and more preferably discolored by light irradiation from the viewpoint of high resolution in pattern processing.

Examples of the sensitizer that is vaporized by heat treatment or discolored by light irradiation include coumarin such as 3,3'-carbonylbis(diethylaminocoumarin), anthraquinone such as 9,10-anthraquinone, aromatic ketones or biphenyl such as benzophenone, 4,4'-dimethoxybenzophenone, acetophenone, 4-methoxyacetophenone and benzaldehyde, condensed aromatics such as 1,4-dimethylnaphthalene, 9-fluorenone, fluorene, phenanthrene, triphenylene, pyrene, anthracene, 9-phenylanthracene, 9-methoxyanthracene 9,10-diphenylanthracene, 9,10-bis(4-methoxyphenyl) anthracene, 9,10-bis(triphenylsilyl) anthracene, 9,10-dimethoxyanthracene, 9,10-diethoxyanthracene, 9,10-dipropoxyanthracene (DPA; manufactured by Kawasaki Kasei Chemicals Ltd.), 9,10-dibutoxyanthracene (DBA; manufactured by Kawasaki Kasei Chemicals Ltd.), 9,10-dipentaoxyanthracene, 2-t-butyl-9,10-dibutoxyanthracene, and 9,10-bis(trimethylsilylethynyl) anthracene.

As the sensitizer that is vaporized by heat treatment, a sensitizer which sublimates or evaporates or a thermally decomposed product by thermal decomposition sublimates or evaporates is preferable. The vaporization temperature of the sensitizer is preferably 150 to 300° C. because it does not vaporize at the pre-baking temperature but decomposes and vaporizes during post-baking to contact and fuse the conductive particles.

The sensitizer content in the conductive paste is preferably 0.001 to 20 parts by mass and more preferably 0.005 to 15 parts by mass with respect to 100 parts by mass of the alkali-soluble resin since the sensitizing effect for sensitizing the photoacid generator is sufficient, the contact between the conductive particles is not hindered, and higher conductivity is obtained.

(Pigments and/or Dyes that Absorb Visible Light)

The conductive paste used in the method for producing a conductive film of the present invention may contain a pigment and/or dye that absorbs visible light within a range that does not inhibit contact and fusion between the conductive particles. Since the conductive paste composition contains a pigment and/or dye that absorbs visible light, reflection due to flash light irradiation can be further suppressed.

Examples of the pigment that absorbs visible light include lactam-based pigments, perylene-based pigments, phthalocyanine-based pigments, isoindoline-based pigments, diaminoanthraquinone-based pigments, dioxazine-based pigments, indanthrone-based pigments, carbon black, and inorganic pigments.

Examples of blue pigment include C.I. Pigment Blue (hereinafter "PB")15, PB15:1, PB15:2, PB15:3, PB15:4, PB15:5, PB15:6, PB16, and PB60. Examples of purple pigment include C.I. Pigment Violet (hereinafter "PV")19, PV23, and PV37. Examples of red pigment include C.I. Pigment Red (hereinafter "PR")149, PR166, PR177, PR179, PR209, and PR254. Examples of green pigment include C.I. Pigment Green (hereinafter "PG")7, PG36, and PG58. Examples of yellow pigment include C.I. Pigment Yellow (hereinafter "PY")150, PY138, PY139, and PY185. Examples of black pigment include furnace black such as HCF, MCF, LFF, RCF, SAF, ISAF, HAF, XCF, FEF, GPF and SRF, carbon black such as thermal black such as FT and MT, channel black and acetylene black, and lactam-based pigments (for example, "Irgaphor" (registered trademark) black S0100CF; manufactured by BASF SE). Among them, carbon black excellent in heat resistance, light resistance and visible light absorption is preferable, and furnace black or lactam-based pigment is more preferable from the viewpoint of conductivity and dispersibility.

Examples of the carbon black can include MA77, 7, 8, 11, 100, 100R, 100S, 230, 220 and 14 (all of which are manufactured by Mitsubishi Chemical Corporation), #52, 47, 45, 45L, 44, 40, 33, 32, 30, 25, 20, 10, 5, 95, 85 and 260 (all of which are manufactured by Mitsubishi Chemical Corporation), Special Black 100, 250, 350 and 550 (all are manufactured by Evonik Corporation), and Printex 95, 90, 55, 45, 40, P, 60, L6, L, 300, 30, ES23, 9, ES22, 35, 25,200, A and G (all of which are manufactured by Evonik Corporation). Among them, MA77, 7, 8, 11, 100, 100R, 100S, 230, 220, or 14, or Special Black 100, 250, 350, or 550 having a pH value of 4 or less is preferable. The pH value of carbon black can be measured according to JIS K5101.

The addition amount of the pigment absorbs visible light in the conductive paste is preferably 0.1 to 10% by mass with respect to the total solid content in the composition.

Examples of the dye that absorbs visible light include ferrocene-based dyes, fluorenone-based dyes, perylene-based dyes, triphenylmethane-based dyes, coumarin-based dyes, diphenylamine-based dyes, quinacridone-based dyes, quinophthalone-based dyes, phthalocyanine-based dyes and xanthene-based dyes. A black dye excellent in heat resistance, light resistance, and visible light absorption is preferable, and VALIFAST (registered trademark) Black 1888, VALIFAST (registered trademark) Black 3830, NUBIAN (registered trademark) Black PA-2802 or OIL Black 860 is preferable.

The addition amount of the dye that absorbs visible light in the conductive paste is preferably 0.1 to 10% by mass with respect to the total solid content in the composition.

(Other Ingredients)

The conductive paste used in the method for producing a conductive film of the present invention may contain an adhesion improving agent, a surfactant, a polymerization inhibitor or the like, as necessary.

Examples of the adhesion improving agent include silane coupling agents such as vinyltrimethoxysilane, vinyltriethoxysilane, vinyltris(2-methoxyethoxy)silane, N-(2-aminoethyl)-3-aminopropylmethyldimethoxysilane, N-(2-aminoethyl)-3-aminopropyltrimethoxysilane, 3-aminopropyltriethoxysilane, 3-glycidoxypropyltrimethoxysilane, 3-glycidoxypropylmethyldimethoxysilane, 2-(3,4-epoxycyclohexyl)ethyltrimethoxysilane, 3-chloropropylmethyldimethoxysilane, 3-chloropropyltrimethoxysilane, 3-methacryloxypropyltrimethoxysilane, and 3-mercaptopropyltrimethoxysilane.

Examples of the surfactant include anionic surfactants such as ammonium lauryl sulfate and polyoxyethylene alkyl ether sulfate triethanolamine, cationic surfactants such as stearylamine acetate and lauryltrimethylammonium chloride, amphoteric surfactants such as lauryldimethylamine oxide and laurylcarboxymethylhydroxyethyl imidazolium betaine, nonionic surfactants such as polyoxyethylene lauryl ether, polyoxyethylene stearyl ether and sorbitan monostearate, fluorosurfactants, and silicon surfactants.

The addition amount of the surfactant in the conductive paste is preferably 0.001 to 10% by mass and more preferably 0.01 to 1% by mass with respect to the entire composition, in order to improve coating properties and uniformity of a surface of a coating film. When the addition amount is less than 0.001% by mass, effects of the coating properties and the uniformity of a surface of a coating film may be insufficient. On the other hand, when the addition amount exceeds 10% by mass, coating film defects such as cissing and dents and particle aggregation may occur.

Examples of the polymerization inhibitor include hydroquinone-based, catechol-based, phosphorus-based, sulfur-based, amine-based and hindered phenol-based compounds. Among them, hydroquinone-based and catechol-based compounds do not inhibit solubility in solvents and dispersion stability of pigments, thus hydroquinone-based or catechol-based compound is preferable, and hydroquinone, tert-butyl-hydroquinone, 2,5-bis(1,1,3,3-tetramethylbutyl) hydroquinone, 2,5-bis(1,1-dimethylbutyl) hydroquinone, catechol or tert-butylcatechol is more preferable.

(Method for Preparing Conductive Paste)

The conductive paste used in the method for producing a conductive film of the present invention is prepared using a disperser such as a ball mill, a sand grinder, a three roll mill, a mild disperser, or a medialess disperser. When the conductive particles are uniformly dispersed, the conductive paste may be prepared by a method of preparing a dispersion in which the conductive particles are dispersed in advance in an organic solvent using dispersant, and mixing this dispersion with a solution containing a monomer, a polymer, an adhesion improving agent, a surfactant, a polymerization inhibitor, and the like. In order to prevent the surface coating layer from being damaged, the dispersion of conductive particles is preferably dispersed using a mild disperser or medialess disperser, and more preferably dispersed using a medialess disperser. The dispersion of conductive particles is, for example, prepared by dispersing conductive particles in an organic solvent, using a disperser such as mild disperser NANO GETTER (registered trademark) (Ashizawa Finetech Ltd.) or high-pressure wet medialess atomizer Nanomizer (NANOMIZER Inc.).

(Conductive Film)

The conductive film of the present invention is a conductive film formed on a substrate, in which the conductive film contains conductive particles and a carbon component, and an element concentration of the carbon component on a surface with less carbon component among front and back surfaces of the conductive film is twice or more lower than an element concentration of the carbon component at a depth of 50 nm toward a central portion of the conductive film from the surface with less carbon component. That is, it is a conductive film having a ratio $C2/C1$ of element concentration $C1$ of the carbon component on a surface with less carbon component and element concentration $C2$ of the carbon component at a depth of 50 nm toward a central portion of the conductive film from the surface with less carbon component of 2 or more.

As a method of measuring the carbon element concentration ratio in the conductive film surface and in the film, it can be calculated from a strength ratio of the carbon component in the conductive film obtained by secondary ion mass spectrometry. Also, in the conductive film of the present invention, the element concentration of the carbon component on a surface with less carbon component among front and back surfaces of the conductive film is preferably 5 times or more and further preferably 10 times or more lower than the element concentration of the carbon component at a depth of 50 nm toward a central portion of the conductive film from the surface with less carbon component. That is, the ratio C2/C1 is preferably 5 or more, and further preferably 10 or more. The upper limit of the ratio C2/C1 is not particularly limited, but is preferably 1000 times or less. Examples of a method of forming a conductive film having a ratio C2/C1 of 2 or more include a method of applying a conductive paste containing conductive particles surface-coated with a carbon simple substance as described above and a photosensitive organic component, and irradiating the formed coating film with flash light.

In addition, it is preferred that the conductive film of the present invention has a wiring and an electrode subjected to patterning; the wiring has a width of 200 μm or less in at least a part thereof; at least one of the wiring and the electrode has a wide portion exceeding a width of 200 μm; the wide portion has an opening and a non-opening; and a width of the conductive film in the non-opening is 200 μm or less. Thus, by combining patterns with a width of 200 μm or less, it is possible to form a wiring or electrode pattern having an arbitrary shape.

(Method of Forming Conductive Film and Conductive Pattern)

Hereinbelow, a method of forming a conductive film and a conductive pattern using a conductive paste will be described in detail.

(Step of Applying Coating Film onto Substrate Using Conductive Paste Containing Conductive Particles and Photosensitive Organic Component)

As a method of applying a conductive paste onto a substrate, a method such as spin coating using a spinner, spray coating, roll coating, screen printing, blade coater, die coater, calendar coater, meniscus coater, bar coater, or inkjet or the like is used to entirely or partially apply the conductive paste. Further, since the coating film thickness varies depending on the coating method, the solid content concentration and viscosity of the composition, and the like, the film thickness after drying is adjusted to a predetermined value.

Next, the solvent is removed from the coating film applied onto the substrate. Thereby, a coating film is formed. Examples of the method of removing the solvent include heat drying using an oven, a hot plate, infrared rays or the like, vacuum drying, and the like. Heat drying is preferably performed in the range of 50° C. to 180° C. for 1 minute to several hours. Thereby, a pattern corresponding to the wiring and a pattern corresponding to the electrode can be collectively formed on the substrate. In addition, it is preferred that, in the method for producing a conductive film of the present invention, the wiring has a width of 200 μm or less in at least a part thereof; at least one of the wiring and the electrode has a wide portion exceeding a width of 200 μm; the wide portion has an opening and a non-opening; and a width of the conductive film in the non-opening is 200 μm or less.

FIG. 1 is a schematic diagram showing an embodiment example of the conductive film of the present invention. As shown in FIG. 1, the conductive film subjected to patterning according to the embodiment example includes an electrode 3 having an opening 1 and a non-opening 2 and a wiring 4. In the embodiment example of FIG. 1, an electrode width 5 exceeds 200 μm. That is, the electrode 3 has a wide portion exceeding 200 μm in width. In the embodiment example of FIG. 1, a wiring width 6 is 200 μm or less. That is, the wiring 4 is the wiring having a width of 200 μm or less in at least a part described above. Further, in the embodiment example of FIG. 1, the wide portion of the electrode 3 has the opening 1 and the non-opening 2. Moreover, a width 7 of the conductive film in the non-opening is 200 μm or less.

As shown in FIG. 1, by providing the non-opening, a wide pattern exceeding 200 μm is formed only by a conductive film pattern having a width of 200 μm or less.

In FIG. 1, four openings 1 are illustrated for simplification of explanation, but the conductive film according to this embodiment is not limited to a conductive film having four openings, and a conductive film having one or more openings may be used as long as the above-described range is satisfied. Moreover, a similar embodiment can also be adopted for a wiring pattern having a wide portion exceeding 200 μm in width.

Further, the shape of the non-opening is not limited to the lattice shape as shown in FIG. 1, and it is sufficient to satisfy the above-described range such as a rectangle or a combination thereof as shown in FIGS. 2 and 3. However, a lattice shape is preferable from the viewpoint of the conductive film area.

Thus, by combining conductive film patterns with a width of 200 μm or less, it is possible to form a wiring or electrode pattern having an arbitrary shape. In addition, when the conductive paste is formed in a pattern on the substrate and the coating film is irradiated with flash light, it is possible to develop conductivity simultaneously and uniformly on the wide portion pattern exceeding 200 μm in width and the pattern having a width of 200 μm or less under the same light irradiation conditions, and further suppress peeling of the pattern from the substrate.

(Step of Processing Coating Film into Coating Film Pattern by Photolithography)

The coating film after removing the solvent is patterned by photolithography. As a light source used for exposure, it is preferable to use i-line (365 nm), h-line (405 nm), and g-line (436 nm) of a mercury lamp.

After exposure, a desired pattern is obtained by removing an unexposed portion using a developing solution. As the developing solution for alkali development, an aqueous solution of a compound such as tetramethylammonium hydroxide, diethanolamine, diethylaminoethanol, sodium hydroxide, potassium hydroxide, sodium carbonate, potassium carbonate, triethylamine, diethylamine, methylamine, dimethylamine, dimethylaminoethyl acetate, dimethylaminoethanol, dimethylaminoethyl methacrylate, cyclohexylamine, ethylenediamine or hexamethylenediamine is preferred. In some cases, as the developing solution, the foregoing aqueous solutions may be used to which polar solvents such as N-methyl-2-pyrrolidone, N,N-dimethylformamide, N,N-dimethylacetamide, dimethylsulfoxide, and γ-butyrolactone, alcohols such as methanol, ethanol, and isopropanol, esters such as ethyl lactate and propylene glycol monomethyl ether acetate, and ketones such as cyclopentanone, cyclohexanone, isobutyl ketone, and methyl isobutyl ketone, and the like are added alone or in combination. Moreover, these alkali aqueous solutions with a surfactant added thereto can be also used as the developing solution. As the developing solution in the case of organic development, polar solvents such as N-methyl-2-pyrrolidone, N-acetyl-2-pyrrolidone, N,N-dimethylacetamide, N,N-dimethylformamide, dimethyl sulfoxide, and hexamethylphosphoric triamide can be used alone, or as a mixed solution, in combination with methanol, ethanol, isopropyl alcohol, xylene, water, methyl carbitol, ethyl carbitol, or the like.

The development can be carried out by a method such as spraying the above-mentioned developing solution onto the coating film surface, while leaving the substrate stationary or rotating the substrate, immersing the substrate in the developing solution, or applying ultrasonic waves while immersing the substrate.

After the development, a rinsing treatment with water may be applied. Again, alcohols such as ethanol and isopropyl alcohol, esters such as ethyl lactate, propylene glycol monomethyl ether acetate, and the like may be added to the water for the rinsing treatment.

Thus, by patterning the conductive film by photolithography, a desired pattern such as the above-described opening and non-opening can be easily formed.

(Step of Irradiating Coating Film or Coating Film Pattern with Flash Light)

Next, in order to develop conductivity, the coating film or the coating film pattern is irradiated with flash light. Heat treatment may be performed before or after the flash light irradiation or simultaneously with the irradiation. Examples of the heat treatment method include heat treatment using an oven, an inert oven, a hot plate, infrared rays, vacuum treatment, and the like. Further, in order to dissipate heat generated by light absorption, flash light may be irradiated while cooling the substrate.

Examples of a light source of the flash light include a xenon lamp, a halogen lamp, a deuterium lamp, an LED, a laser, plasma, a light emitting diode, an incandescent bulb, light sources using kanthal wire, tungsten, carbon or the like as a filament. In the method for producing a conductive film of the present invention, the light source of the flash light is preferably a light source selected from the group consisting of a xenon lamp, a halogen lamp, a deuterium lamp, and plasma. The light source of the flash light is a light source selected from such a group, whereby it is possible to irradiate light having a continuous wavelength spectrum from ultraviolet to infrared. Also, in the method for producing a conductive film of the present invention, the light source is more preferably a xenon lamp or a halogen lamp, and further preferably a xenon lamp. The light source is a xenon lamp or a halogen lamp, and further preferably a xenon lamp, whereby it is possible to irradiate light including a near-infrared region.

In the present invention, flash light irradiation refers to irradiation of light with a lighting time of 1 µs to 10,000 µs, and the lighting time is referred to as pulse irradiation time. In the present invention, the pulse irradiation time of the flash light may be adjusted as appropriate, but is preferably within the range of 10 µs to 5000 µs, and more preferably within the range of 10 µs to 2000 µs. Further, the irradiation energy per flash light is preferably 0.1 J/cm$^2$ to 50 J/cm$^2$, and more preferably 0.1 J/cm$^2$ to 5 J/cm$^2$.

The number of flash light irradiations may be appropriately adjusted according to the composition, film thickness, area, and the like of the coating film, and the number of irradiations may be only once or may be repeated two or more times. When the flash light is irradiated a plurality of times, the irradiation interval of the flash light may be adjusted as appropriate. In particular, the irradiation interval is preferably set within the range of 10 µsec to 1 second, and more preferably set within the range of 50 µsec to 1 second. By setting the flash light as described above, it is possible to suppress a rapid modification of the coating film, the pattern and the substrate to obtain a film and a pattern excellent in conductivity.

The thickness of the conductive film and conductive pattern thus obtained may be appropriately adjusted according to the application, but is preferably about 0.01 µm to 100 µm.

(Field Effect Transistor)

The method for producing a field effect transistor (hereinafter referred to as FET) of the present invention is a method for producing a field effect transistor including steps (1) to (4):

(1) forming a first electrode;
(2) forming an insulating layer;
(3) forming a second electrode and a third electrode that are electrically insulated from the first electrode by the insulating layer; and
(4) forming a semiconductor layer between the second electrode and the third electrode, in which at least one of the first electrode, the second electrode, and the third electrode is formed of a conductive film, and the conductive film is produced using the method for producing a conductive film of the present invention.

FIG. 4 is a schematic cross-sectional view showing an example of an embodiment of a method for producing an FET of the present invention. In FIG. 4, (1) a first electrode 12 is formed on a surface of a substrate 11 having an undercoat layer 13 by using the method of forming a coating film described above, (2) an insulating layer 14 is formed so as to cover the first electrode 12, (3) a second electrode 15 and a third electrode 16 are formed on the insulating layer 14, and (4) a semiconductor layer 17 is formed between the second electrode 15 and the third electrode 16 by a coating method.

Although not shown in FIG. 4, a step of forming a wiring for the first electrode, a wiring for the second electrode, and a wiring for the third electrode may be further included.

The structure of FET fabricated by the production method shown in FIG. 4 is a so-called bottom gate structure in which the first electrode is arranged on a lower side (substrate side) of the semiconductor layer, and the second electrode and the third electrode are arranged on the same plane of the semiconductor layer, but is not limited to this, and may be a so-called top gate structure in which the third electrode is arranged on an upper side (opposite the substrate) of the semiconductor layer by changing the order of the steps (1) and (3), and the first electrode and the second electrode are arranged on the same plane as the semiconductor layer.

At least one electrode in the step (1) or (3) is formed of a conductive film, and the conductive film is produced using the method for producing a conductive film of the present invention. As a more specific method of forming an electrode, the method of forming a conductive film described above can be used. When the method of forming a conductive film described above is used for the second electrode 15 and the third electrode 16, the insulating layer 14 also serves as an undercoat layer.

Further, other electrodes may be formed by combining known techniques. Examples of known techniques include a resistance heating vapor deposition method, an electron beam method, a sputtering method, a plating method, a CVD method, and the like. In addition, as a method of forming an electrode pattern, an electrode thin film prepared by the above method may be subjected to patterning into a desired shape by a known photolithography method or the like, or subjected to patterning through a mask in a desired shape at the time of vapor deposition or sputtering of an electrode material.

In that regard, the material used for the electrode may be any conductive material as long as it can generally be used as an electrode. Examples of the material include, but not limited to, conductive metal oxides such as tin oxide, indium oxide, and indium tin oxide; metals such as platinum, gold, silver, copper, iron, tin, zinc, aluminum, indium, chromium, lithium, sodium, potassium, cesium, calcium, magnesium, palladium, molybdenum, amorphous silicon, and polysilicon, and alloy thereof; inorganic conductive compounds such as copper iodide and copper sulfide; polythiophene, polypyrrole, polyaniline; a complex of polyethylenedioxythiophene and polystyrene sulfonic acid; conductive polymers of which conductivity is improved by doping with iodine or the like; carbon materials; materials having an organic component and a conductor; and the like.

These electrode materials may be used alone, or a plurality of materials may be laminated or used in mixture.

Examples of a method of forming an insulating layer in the step (2) include, but are not limited to, known techniques such as a resistance heating vapor deposition method, an electron beam method, a sputtering method, a plating method, a CVD method, an ion plating coating method, an ink jet method, a printing method, a spin coating method, a blade coating method, a slit die coating method, a screen printing method, a bar coater method, a casting method, a transfer printing method, and an immersion and withdrawal method.

The material used for the insulating layer is not particularly limited, but examples of the material include inorganic materials such as silicon oxide and alumina; organic materials such as polyimide, polyvinyl alcohol, polyvinyl chloride, polyethylene terephthalate, polyvinylidene fluoride, polysiloxane, and polyvinyl phenol; and a mixture of an inorganic material powder and an organic material. Above all, it is preferable to include an organic compound containing a bond between a silicon atom and a carbon atom. In addition, it is further preferable to include a metal compound containing a bond between a metal atom and an oxygen atom.

The insulating layer may be a single layer or a plurality of layers. Also, one layer may be formed from a plurality of insulating materials, or a plurality of insulating materials may be laminated to form a plurality of insulating layers.

As a method of forming the semiconductor layer in the step (4), it is also possible to use a dry method such as resistance heating vapor deposition, electron beam, sputtering, or CVD, but from the viewpoint of manufacturing cost and adaptability to large areas, it is preferable to use a coating method. The same method as described for the composition can be used as the coating method, and examples of the coating method include known coating methods such as a spin coating method, a blade coating method, a slit die coating method, a screen printing method, a bar coating method, a casting method, a transfer printing method, an immersion and withdrawal method, and an ink jet method. The coating method can be selected according to the properties of the coating film to be obtained, such as coating thickness control and orientation control. In addition, the formed coating film may be subjected to an annealing treatment under the atmosphere, under reduced pressure, or under an inert gas atmosphere (under a nitrogen or argon atmosphere).

The semiconductor material used for the semiconductor layer is not particularly limited as long as it has semiconducting properties, and an inorganic semiconductor such as a silicon semiconductor or oxide semiconductor, an organic semiconductor such as pentacene or polythiophene derivative, a carbon semiconductor such as carbon nanotube (hereinafter sometimes referred to as CNT), graphene or fullerene can be used. Among them, CNT, graphene, fullerene, and organic semiconductors are preferable because they can be formed by coating.

More preferably, in the method for producing a field effect transistor of the present invention, the step of forming a semiconductor layer includes a procedure of applying a solution containing carbon nanotubes. By applying a solution containing carbon nanotubes, a semiconductor layer can be formed at a low temperature of 200° C. or lower, and high semiconductor characteristics can be easily obtained.

Further, use of a CNT composite having a conjugated polymer attached to at least a part of a surface of CNT is particularly preferable because it is possible to uniformly disperse the CNT in the solution without impairing the high electrical properties possessed by the CNT. Further, by using a solution in which CNTs are uniformly dispersed, a film in which CNTs are uniformly dispersed can be formed by a coating method such as an ink jet method.

Examples of a method for attaching the conjugated polymer to the CNT include: (I) a method of adding and mixing the CNT to and with the melted conjugated polymer; (II) a method of dissolving the conjugated polymer in a solvent, and adding and mixing the CNT to and with the solvent; (III) a method of adding and mixing the conjugated polymer to and with CNTs dispersed in a solvent in advance with ultrasonic waves or the like; (IV) a method of putting the conjugated polymer and the CNT in a solvent, and irradiating the mixed system with ultrasonic waves for mixing the system, and the like. In the present invention, any method may be used, and a plurality of methods may be combined.

Examples of the conjugated polymer include a polythiophene polymer, a polypyrrole polymer, a polyaniline polymer, a polyacetylene polymer, a poly-p-phenylene polymer, a poly-p-phenylene vinylene polymer, and the like, but are not particularly limited. As the polymer, a polymer in which single monomer units are arranged is preferably used, but a polymer obtained by block copolymerization or random copolymerization of different monomer units is also used. In addition, it is also possible to use a polymer obtained by graft polymerization.

(Ferroelectric Memory Element)

One embodiment of a method for producing a ferroelectric memory element using the conductive film obtained by the method for producing a conductive film of the present invention is a method for producing a ferroelectric memory element including steps (a) to (c):

(a) forming a first electrode of a ferroelectric memory element;

(b) forming a ferroelectric layer on the first electrode of the ferroelectric memory element; and (c) forming a second electrode of the ferroelectric memory element on the ferroelectric layer, in which at least one of the first electrode of the ferroelectric memory element or the second electrode of the ferroelectric memory element is formed of a conductive film, and the conductive film is produced using the method for producing a conductive film of the present invention.

FIG. 5 is a schematic cross-sectional view showing an example of a method for producing a ferroelectric element using a conductive film obtained by the method for producing a conductive film of the present invention. In FIG. 5, (a) a first electrode 22 is formed on a surface of a substrate 21 having an undercoat layer 23 by using the method of forming a coating film and a pattern described above, (b) a ferroelectric layer 24 is formed so as to cover the first electrode 22, and (c) a second electrode 25 is formed on the ferroelectric layer 24.

Although not shown in FIG. 5, a step of forming a wiring for the first electrode and a wiring for the second electrode may be further included.

The electrode of the ferroelectric memory element in at least one of the step (a) or (c) is formed of a conductive film, and the conductive film is produced using the method for producing a conductive film of the present invention. When the method of forming a conductive film described above is used for the second electrode 25, the ferroelectric layer 24 also serves as an undercoat layer. As a more specific method of forming an electrode, the method of forming a conductive film and a conductive pattern described above can be used.

Examples of a method of forming a ferroelectric layer in the step (b) include, but are not limited to, known techniques such as a resistance heating vapor deposition method, an electron beam method, a sputtering method, a plating method, a CVD method, an ion plating coating method, an ink jet method, a printing method, a spin coating method, a blade coating method, a slit die coating method, a screen printing method, a bar coater method, a casting method, a transfer printing method, and an immersion and withdrawal method.

The ferroelectric layer refers to a layer that exhibits ferroelectric characteristics. The ferroelectric characteristic refers to a characteristic in which electric dipoles are aligned even when there is no electric field outside, and the direction of the dipoles is inverted by an external electric field (this is called polarization inversion).

The material contained in the ferroelectric layer is not particularly limited as long as it is a compound exhibiting ferroelectric characteristics, and examples thereof include inorganic and organic ferroelectric compounds. Examples of the inorganic ferroelectric compound include, but are not limited to, lead zirconate titanate, barium titanate, Bi-layered ferroelectric materials, pyroniobates such as $(Na_{0.5}K_{0.5})NbO_3$, and the like.

Examples of the organic ferroelectric compound include, but are not limited to, fluorine-containing oligomers or polymers represented by copolymers such as polyvinylidene fluoride (PVDF), poly(vinylidene fluoride-trifluoroethylene) (PVDF-TrFE), poly(vinylidene fluoride-tetrafluoroethylene) (PVDF-TeFE), poly(vinylidene fluoride-chlorotrifluoroethylene) (PVDF-CTFE), poly(vinylidene fluoride-chlorofluoroethylene) (PVDF-CFE), poly(vinylidene fluoride-trifluoroethylene-chlorofluoroethylene) (PVDF-TrFE-CFE), and poly(vinylidene fluoride-trifluoroethylene-chlorotrifluoroethylene) (PVDF-TrFE-CTFE), polyvinylidene cyanide (PVCN), nylons having an odd number of methylene chains, deoxyribonucleic acid (DNA), imidazole derivatives, and croconic acid derivatives, and the like.

These inorganic ferroelectric compounds and organic ferroelectric compounds can be used alone or in combination of two or more.

(Capacitor)

One embodiment of a method for producing a capacitor using the conductive film obtained by the method for producing a conductive film of the present invention is a method for producing a capacitor including steps (A) to (C):
(A) forming a capacitor first electrode;
(B) forming a dielectric layer on the conductive film; and
(C) forming a second electrode of the capacitor on the dielectric layer,
in which at least one of the first electrode of the capacitor or the second electrode of the capacitor is formed of a conductive film, and the conductive film is produced using the method for producing a conductive film of the present invention.

FIG. 6 is a schematic cross-sectional view showing an example of a method for producing a capacitor using a conductive film obtained by the method for producing a conductive film of the present invention. In FIG. 6, (A) a first electrode 35 of the capacitor is formed on a surface of a substrate 31 having an undercoat layer 33 by using the method of forming a coating film and a pattern described above, (B) a dielectric layer 34 is formed so as to cover the first electrode 35, and (C) a second electrode 36 of the capacitor is formed on the dielectric layer 34.

Although not shown in FIG. 6, a step of forming a wiring for the first electrode and a wiring for the second electrode may be further included.

The electrode of the capacitor in at least one of the step (A) or (C) is formed of a conductive film, and the conductive film is produced using the method for producing a conductive film of the present invention. When the method of forming a conductive film described above is used for the second electrode 36, the dielectric layer 34 also serves as an undercoat layer. As a more specific method of forming an electrode, the method of forming a conductive film and a conductive pattern described above can be used.

Examples of a method of forming a dielectric layer in the step (B) include, but are not limited to, known techniques such as resistance heating vapor deposition, electron beam, sputtering, plating, CVD, ion plating coating, ink jet, printing, a spin coating method, a blade coating method, a slit die coating method, a screen printing method, a bar coater method, a casting method, a transfer printing method, and an immersion and withdrawal method.

As a method of forming a dielectric layer in the step (B), the same method as in the step (b) of the method for producing a ferroelectric memory element described above can be used.

The dielectric material is not particularly limited, but the same material as the insulating layer of the above-described field effect transistor can be used.

(Wireless Communication Device)

One embodiment of a method for producing a wireless communication device of the present invention is a method for producing a wireless communication device of the present invention, including steps of forming a field effect transistor on a substrate; and forming an antenna on the substrate, in which the field effect transistor is formed using the method for producing a field effect transistor of the present invention.

A method for producing a wireless communication device containing the FET obtained by the above method will ° be described. This method includes steps of: forming an FET by the above-described production method; and forming an antenna pattern on a surface of a substrate on which the FET is formed. The order of forming the field effect transistor and the antenna pattern is not restricted. In the present invention, the antenna is intended to transmit and receive radio waves.

The wireless communication device is a device that performs electrical communication in a way that an RFID tag receives a carrier wave transmitted from an antenna mounted on an external reader/writer, such as RFID, for example.

As a specific operation, for example, an antenna of the RFID tag receives a radio signal transmitted from the antenna mounted on the reader/writer, and the FET in the RFID operates in response to a command of the radio signal. Thereafter, a reply as a result in response to the command is transmitted as a radio signal from the antenna of the RFID tag to the antenna of the reader/writer. The operation in response to the command is performed by a known demodulation circuit, an operation control logic circuit, a modulation circuit or the like composed of FETs.

As shown in FIG. 7 and FIG. 8 by way of example, the wireless communication device can be produced by forming, on a substrate 100 with an antenna pattern 101 formed, a circuit 102 including the FET produced by the method for producing the FET of the present invention, and a connection wiring 103 between the circuit 102 and the antenna.

Examples of the method for forming the antenna pattern and the connection wiring pattern include: a method of processing a metal foil such as a copper foil or an aluminum foil with the use of a punching blade and transferring the foil to the substrate, a method of etching a metal foil attached to the substrate, with a resist layer formed on the metal foil as a mask, a method of forming a pattern of a conductive paste on the substrate by a coating method, and curing the pattern by heat or light.

Another embodiment of the method for producing a wireless communication device of the present invention is a method for producing a wireless communication device, including steps of: forming a field effect transistor on a substrate; and forming an antenna on the substrate, in which the antenna is preferably formed of a conductive film, and the conductive film is preferably formed using the method for producing a conductive film of the present invention. By including such a procedure, the production efficiency of the wireless communication device can be further improved. As a method for producing a field effect transistor in this embodiment, the method for producing a field effect transistor of the present invention may be used, or a generally used field effect transistor may be used.

(Other Applications)

So far, the applications using the method for producing a conductive film of the present invention have been described, but the present invention should not be limited only by the above-described applications. For example, the method for producing a conductive film of the present invention can be suitably utilized also for formation of a conductive pattern used for touchscreen, display, image sensor, organic electroluminescent illumination, solar cell, or the like.

EXAMPLES

Hereinafter, examples of the present invention will be described. First, materials used in examples and comparative examples will be described. Hereinafter, the present invention will be described more specifically based on examples. It should be noted that the present invention is not to be considered limited to the following examples. Each evaluation method in the examples will be described in the following [1] and [2].

[1] Evaluation of Resistance Value

Surface resistance value ($\Omega$/□) was measured using a surface resistance meter (Loresta (registered trademark)-FP; manufactured by Mitsubishi Petrochemical Co., Ltd.). Further, film thickness (cm) was measured using a surface roughness measurement apparatus (Surfcom (registered trademark) 1400D; manufactured by TOKYO SEIMITSU CO, LTD.). Volume resistivity ($\mu\Omega \cdot cm$) was calculated by multiplying both the surface resistance value and the film thickness.

[2] Evaluation of FET Mobility

Source-drain current (Id)-source-drain voltage (Vsd) characteristics when FET gate voltage (Vg) was changed were measured. The measurement was performed in an atmosphere using Model 4200-SCS Semiconductor Characterization System (manufactured by Keithley Instruments). Mobility was obtained from the change in the value of Id at Vsd of −5V when changing Vg from +20V to −20V.

Synthesis Example; Alkali-Soluble Resin 1

A 500 mL flask was charged with 2 g of 2,2'-azobis (isobutyronitrile) and 50 g of propylene glycol monoethyl ether acetate (hereinafter referred to as PGMEA). Thereafter, 15.69 g of methacrylic acid, 37.45 g of styrene, and 46.86 g of dicyclopentanyl methacrylate were charged and stirred at room temperature for a while. The interior of the flask was thoroughly purged with nitrogen by bubbling, and then heated and stirred at 70° C. for 5 hours. Next, 10.46 g of glycidyl methacrylate, 1 g of dimethylbenzylamine, 0.2 g of p-methoxyphenol and 100 g of PGMEA were added to the resulting solution, and the mixture was heated and stirred at 90° C. for 4 hours to obtain a solution of Alkali-soluble Resin 1. PGMEA was added to the obtained solution of Alkali-soluble Resin 1 so that the solid concentration was 40% by mass. The weight average molecular weight (Mw) of the acrylic resin was 25,000.

Preparation Example 1; Photosensitive Resin Solution 1 (Photosensitive Organic Component)

In a clean bottle, 25.0 g of a solution of Alkali-soluble Resin 1 (40% by mass), 1.5 g of Irgacure (registered trademark) OXE02 (oxime ester-based compound; manufactured by BASF SE) as a photopolymerization initiator, 5.5 g of light acrylate (registered trademark) PE-4A (manufactured by KYOEISHA CHEMICAL Co., LTD.) and 2.0 g of DISPERBYK (registered trademark) 140 (manufactured by BYK Japan KK) (amine value: 146 mgKOH/g) as a dispersant were added and mixed with a rotation-revolution vacuum mixer "Awatori Rentaro" (registered trademark) (ARE-310; manufactured by Thinky Corporation) to obtain Photosensitive Resin Solution 1.

Preparation Example 2; Conductive Paste A

To the obtained Photosensitive Resin Solution 1, silver particles (manufactured by NISSHIN ENGINEERING INC.) with an average thickness of a surface carbon coating layer of 1 nm and an average particle diameter of 40 nm as conductive particles were added, and further PGMEA was added so that the solid content ratio was 80% by mass, then the mixture was kneaded using a three roll mill (EXAKT M-50; manufactured by EXAKT) to obtain Conductive Paste A.

Preparation Example 3; Conductive Paste B

To the Photosensitive Resin Solution 1 obtained by the same method as described above, silver fine particles (manufactured by NISSHIN ENGINEERING INC.) with an average thickness of a surface carbon coating layer of 5 nm and a particle diameter of 40 nm were added, and further PGMEA was added so that the solid content ratio was 80% by mass, then the mixture was kneaded using a three roll mill (EXAKT M-50; manufactured by EXAKT) to obtain Conductive Paste B.

Preparation Example 4; Conductive Paste C

To the Photosensitive Resin Solution 1 obtained by the same method as described above, silver fine particles (manufactured by NISSHIN ENGINEERING INC.) with an average thickness of a surface carbon coating layer of 5 nm and a particle diameter of 60 nm were added, and further PGMEA was added so that the solid content ratio was 80% by mass, then the mixture was kneaded using a three roll mill (EXAKT M-50; manufactured by EXAKT) to obtain Conductive Paste C.

Preparation Example 5; Conductive Paste D

To the Photosensitive Resin Solution 1 obtained by the same method as described above, silver fine particles (manufactured by NISSHIN ENGINEERING INC.) with an average thickness of a surface carbon coating layer of 3 nm and an average particle diameter of 200 nm were added, and further PGMEA was added so that the solid content ratio was 80% by mass, then the mixture was kneaded using a three roll mill (EXAKT M-50; manufactured by EXAKT) to obtain Conductive Paste D.

Adjustment Example 6; Conductive Paste E

To the Photosensitive Resin Solution 1 obtained by the same method as described above, silver fine particles (manufactured by NISSHIN ENGINEERING INC.) with an average thickness of a surface carbon coating layer of 1 nm and an average particle diameter of 200 nm were added, and further PGMEA was added so that the solid content ratio was 80% by mass, then the mixture was kneaded using a three roll mill (EXAKT M-50; manufactured by EXAKT) to obtain Conductive Paste E.

Preparation Example 7; Conductive Paste F 80.00 g of silver particles with an average particle diameter of 200 nm (manufactured by Mitsui Metals Co., Ltd.), 4.06 g of DISPERBYK (registered trademark) 140 (manufactured by BYK Japan KK) (amine value: 146 mgKOH/g) as a dispersant, and 196.14 g of PGMEA were mixed with a homogenizer at 1200 rpm for 30 minutes, and the mixed solution was further dispersed using a mill-type disperser filled with zirconia beads to obtain Conductive Paste F.

Preparation Example 8; Conductive Paste G

To Photosensitive Resin Solution 1, 80.0 g of silver particles (manufactured by NISSHIN ENGINEERING INC.) with an average particle diameter of 200 nm as conductive particles were added, and further PGMEA was added so that the solid content ratio was 80% by mass, then the mixture was kneaded using a three roll mill (EXAKT M-50; manufactured by EXAKT) to obtain Conductive Paste G.

Preparation Example 9; Undercoat Layer Solution A 61.29 g (0.45 mol) of methyltrimethoxysilane, 12.31 g (0.05 mol) of 2-(3,4-epoxycyclohexyl)ethyltrimethoxysilane, and 99.15 g (0.5 mol) of phenyltrimethoxysilane were dissolved in 203.36 g of propylene glycol monobutyl ether (boiling point 170° C.), and 54.90 g of water and 0.864 g of phosphoric acid were added thereto with stirring. The obtained solution was heated at a bath temperature of 105° C. for 2 hours to raise the internal temperature up to 90° C., thereby distilling off a component mainly composed of methanol as a by-product. Next, the solution was heated at a bath temperature of 130° C. for 2.0 hours to raise the internal temperature up to 118° C., thereby distilling off a component mainly composed of water and propylene glycol monobutyl ether, and then cooled to room temperature to obtain Polysiloxane Solution A with a solid content concentration of 26.0% by mass. The obtained polysiloxane had a weight average molecular weight of 6000.

The obtained polysiloxane solution A was weighed for 10 g, and mixed with 54.4 g of propylene glycol monoethyl ether acetate (hereinafter, referred to as PGMEA), and the mixture was stirred at room temperature for 2 hours to obtain Undercoat Layer Solution A.

Preparation Example 10: Undercoat Layer B

A 36% by weight PGMEA solution of acrylic resin SPCR-10X (trade name, manufactured by Showa Denko K.K.) was weighed for 8 g, and mixed with 40 g of PGMEA, and the mixture was stirred at room temperature to obtain Undercoat Layer Solution B.

Preparation Example 11; Undercoat Layer C

A 58% by weight methyl isobutyl ketone solution of acrylic resin V-6841 (trade name, manufactured by DIC Corporation) was weighed for 8 g, and mixed with 15 g of PGMEA, and the mixture was stirred at room temperature to obtain Undercoat Layer Solution C.

Example 1

Conductive Paste A was applied onto a PET substrate (film thickness 50 µm) by screen printing so that the dry film thickness was 1 µm, and the obtained coating film was pre-baked in a hot air oven at 100° C. for 1 minute. The obtained prebaked film was irradiated with flash light (energy amount: 2 J cm$^{-2}$) using a flash lamp annealing device (PulseForge1200 (manufactured by NOVACENTRIX)). Conductivity was evaluated according to the following criteria from the surface resistance value of the conductive film after flash light irradiation. The results are shown in Table 1.

The surface resistance value was evaluated as follows:
"A": less than 100 Ω/☐
"B": 100Ω/☐ or more and less than 1 kΩ/☐
"C": 1 kΩ/☐ or more and less than 1 MΩ/☐
"D": 1 MΩ/☐ or more or unmeasurable.

Example 2

Undercoat Layer Solution A was applied by spin coating onto a PET substrate (film thickness 50 µm) under the conditions of 800 rpm×20 seconds and then subjected to a heat treatment at 120° C. for 5 minutes, thereafter, Undercoat Layer Solution A was again applied by spin coating under the conditions of 800 rpm×20 seconds and subjected to a heat treatment at 150° C. for 30 minutes, thereby forming Undercoat Layer A with a film thickness of 500 nm.

Next, Conductive Paste A was applied onto Undercoat Layer A by screen printing so that the dry film thickness was 1 µm, and the obtained coating film was pre-baked in a hot air oven at 100° C. for 1 minute. The obtained prebaked film was irradiated with flash light (energy amount: 2 J cm$^{-2}$)

using a flash lamp annealing device (PulseForge1200 (manufactured by NOVACENTRIX)). Conductivity was evaluated according to the same criteria as in Example 1 from the surface resistance value of the conductive film after flash light irradiation. The results are shown in Table 1.

Examples 3 to 7

The undercoat layers and the conductive films of the conductive paste shown in Table 1 were obtained in the same manner as in Example 2, and each conductive film was evaluated in the same manner as in Example 1. The evaluation results are shown in Table 1.

Comparative Example 1

Undercoat Layer Solution A was applied by spin coating onto a PET substrate (film thickness 50 μm) under the conditions of 800 rpm×20 seconds, and then subjected to a heat treatment at 120° C. for 5 minutes. Undercoat Layer Solution A was again applied by spin coating under the conditions of 800 rpm×20 seconds and subjected to a heat treatment at 150° C. for 30 minutes to form Undercoat Layer A with a film thickness of 500 nm.

Next, Conductive Paste F was applied onto Undercoat Layer A by screen printing so that the dry film thickness was 1 μm, and the obtained coating film was pre-baked in a hot air oven at 100° C. for 1 minute. The obtained prebaked film was irradiated with flash light (energy amount: 2 J cm$^{-2}$) using a flash lamp annealing device (PulseForge1200 (manufactured by NOVACENTRIX)). Conductivity was evaluated according to the following criteria from the surface resistance value of the conductive film after flash light irradiation. The results are shown in Table 1.

Comparative Example 2

A conductive film of Conductive Paste G was obtained in the same manner as in Comparative Example 1, and evaluated in the same manner as, in Example 1. The evaluation results are shown in Table 1.

Example 8

Undercoat Layer Solution A was applied by spin coating onto a PET substrate (film thickness 50 μm) under the conditions of 800 rpm×20 seconds, and then subjected to a heat treatment at 120° C. for 5 minutes. Undercoat Layer Solution A was again applied by spin coating under the conditions of 800 rpm×20 seconds and subjected to a heat treatment at 150° C. for 30 minutes to form Undercoat Layer A with a film thickness of 500 nm.

Next, Conductive Paste A was applied by spin coating onto Undercoat Layer A using a spin coater under the conditions of 500 rpm for 10 seconds and 1000 rpm for 4 seconds, and then pre-baked at 90° C. for 1 minute using a hot plate to obtain a pre-baked film with a film thickness of 1 μm. Thereafter, exposure was carried out using an exposure apparatus "PEM-8M" (trade name, manufactured by Union Optical Co., Ltd.) through a photomask having a stripe-shaped translucent pattern (10 μm×20 mm), then dip development was carried out with a 0.5% KOH solution for 60 seconds, and the obtained film was rinsed with ultrapure water to obtain a stripe pattern. The obtained stripe pattern was irradiated with flash light in the same manner as in Example 1. Conductivity was evaluated according to the following criteria from the surface resistance value and film thickness of the striped conductive pattern after flash light irradiation.

The volume resistivity was evaluated as follows:
"A": less than 100 μΩ·cm
"B": 100μΩ·cm or more and less than 1 mΩ·cm
"C": 1 mΩ·cm or more or unmeasurable Further, a line width of the striped conductive pattern was measured with a microscope, and resolution was evaluated. The results are shown in Table 2.

Resolution
"A": A stripe-shaped conductive pattern of 10 μm×20 mm can be formed.
"B": A stripe-shaped conductive pattern of 10 μm×20 mm cannot be formed.

TABLE 1

|  | Conductive paste | Undercoat layer | Average thickness of surface coating layer (nm) | Average particle diameter (nm) | Carbon weight ratio (%) | Surface resistance value |
|---|---|---|---|---|---|---|
| Example 1 | Conductive Paste A | None | 1 | 40 | 3 | A |
| Example 2 | Conductive Paste A | Undercoat Layer Solution A | 1 | 40 | 3 | A |
| Example 3 | Conductive Paste A | Undercoat Layer Solution B | 1 | 40 | 3 | A |
| Example 4 | Conductive Paste B | Undercoat Layer Solution C | 5 | 40 | 18 | A |
| Example 5 | Conductive Paste C | Undercoat Layer Solution A | 5 | 60 | 11 | A |
| Example 6 | Conductive Paste D | Undercoat Layer Solution A | 3 | 200 | 2 | A |
| Example 7 | Conductive Paste E | Undercoat Layer Solution A | 1 | 200 | 0.6 | A |
| Comparative Example 1 | Conductive Paste F | Undercoat Layer Solution A | 0 | 200 | 0 | B |
| Comparative Example 2 | Conductive Paste G | Undercoat Layer Solution A | 0 | 200 | 0 | B |

In the present invention, the fact that a conductive pattern can be formed means that a stripe-shaped conductive pattern of 10 μm×20 mm can be formed in an error range of 2 μm, and transmittance at 400 nm before and after pattern formation is measured with respect to an unexposed portion using a spectrophotometer, transmittance change represented by formula $(T_0-T)/T_0$ is calculated, wherein $T_0$ is the transmittance before pattern formation and T is the transmittance after film formation, and the transmittance change is less than 1% are both satisfied.

Examples 9 and 10

Conductive patterns of the conductive paste shown in Table 2 were obtained in the same manner as in Example 8, and each conductive pattern was evaluated in the same manner as in Example 1. The evaluation results are shown in Table 2.

Comparative Example 3

A conductive pattern of Conductive Paste G was obtained in the same manner as in Example 8, and evaluated in the same manner as in Example 1. The evaluation results are shown in Table 2.

TABLE 2

|  | Undercoat layer | Conductive paste | Resolution | Volume resistivity |
|---|---|---|---|---|
| Example 8 | Undercoat Layer Solution A | Conductive Paste A | A | A |
| Example 9 | Undercoat Layer Solution A | Conductive Paste B | A | A |
| Example 10 | Undercoat Layer Solution A | Conductive Paste C | A | A |
| Comparative Example 3 | Undercoat Layer Solution A | Conductive Paste G | B | C |

Example 11

After applying by spin coating onto a PET substrate (film thickness 50 μm) under the conditions of 800 rpm×20 seconds, and then subjected to a heat treatment at 120° C. for 5 minutes. Undercoat Layer Solution A was again applied by spin coating under the conditions of 800 rpm×20 seconds and subjected to a heat treatment at 150° C. for 30 minutes to form Undercoat Layer A with a film thickness of 500 nm.

Next, Conductive Paste A was applied by spin coating onto Undercoat Layer A using a spin coater under the conditions of 1500 rpm for 10 seconds, and then pre-baked at 90° C. for 1 minute using a hot plate to obtain a pre-baked film with a film thickness of 300 nm. Thereafter, exposure was carried out using an exposure apparatus "PEM-8M" (trade name, manufactured by Union Optical Co., Ltd.) through a photomask having a non-opening shown in FIG. 1 as a translucent pattern, then dip development was carried out with a 0.5% KOH solution for 60 seconds, and the obtained film was rinsed with ultrapure water to obtain a pattern. The translucent pattern design of the photomask was such that the wiring portion was 10 μm×20 mm, the electrode portion was 310 μm×310 μm, the opening width of the electrode portion was 10 μm, and the non-opening was 10 μm×10 μm. The obtained pattern was irradiated with flash light (energy amount: 1 J cm$^{-2}$) using a flash lamp annealing device (PulseForge1200 (manufactured by NOVACENTRIX)). Conductivity was evaluated according to the following criteria from the surface resistance value of the conductive film after flash light irradiation.

The volume resistivity was evaluated as follows:
"A": less than 100 μΩ·cm
"B": 100 μΩ·cm or more and less than 1 mΩ·cm
"C": 1 mΩ·cm or more or unmeasurable Moreover, the electrode pattern was measured with a microscope, and resolution and pattern peeling were evaluated. The results are shown in Table 3.

Resolution
"A": A non-opening pattern and an opening pattern can be formed within a pattern width error range of 2 μm.
"B": A non-opening pattern and an opening pattern cannot be formed within a pattern width error range of 2 μm.

In the present invention, the fact that transmittance at 400 nm before and after pattern formation is measured with respect to an unexposed portion using a spectrophotometer, transmittance change represented by formula $(T_0-T)/T_0$ is calculated, wherein $T_0$ is the transmittance before pattern formation and T is the transmittance after film formation, and the transmittance change is less than 1% are both satisfied.

Pattern Peeling
"A": The non-opening pattern and the opening pattern are maintained within the pattern width error range of 2 μm with respect to the pattern after flash light irradiation, and the pattern does not float or turn.
"B": The non-opening pattern and the opening pattern cannot be maintained within the pattern width error range of 2 μm with respect to the pattern after flash light irradiation, and the pattern floats or turns.

Examples 12 to 19

The width and length of the wiring portion were the same as in Example 11, and conductive patterns having the conductive paste, the size of the electrode portion, the width of the opening and non-opening shown in Table 3 were formed in the same manner as in Example 11, and each conductive pattern was evaluated in the same manner as in Example 11. The evaluation results are shown in Table 3.

TABLE 3

|  | Undercoat layer | Conductive paste | Electrode portion (μm × μm) | Opening width (μm) | Non-opening width (μm) | Resolution | Electrode portion peeling | Volume resistivity |
|---|---|---|---|---|---|---|---|---|
| Example 11 | Undercoat Layer Solution A | Conductive Paste A | 310 × 310 | 10 | 10 | A | A | A |
| Example 12 | Undercoat Layer Solution A | Conductive Paste B | 310 × 310 | 10 | 10 | A | A | A |
| Example 13 | Undercoat Layer Solution A | Conductive Paste C | 310 × 310 | 10 | 10 | A | A | A |
| Example 14 | Undercoat Layer Solution A | Conductive Paste A | 320 × 320 | 20 | 20 | A | A | A |
| Example 15 | Undercoat Layer | Conductive Paste A | 350 × 350 | 50 | 50 | A | A | A |

TABLE 3-continued

|  | Undercoat layer | Conductive paste | Electrode portion (μm × μm) | Opening width (μm) | Non-opening width (μm) | Resolution | Electrode portion peeling | Volume resistivity |
|---|---|---|---|---|---|---|---|---|
| Example 16 | Undercoat Layer Solution A | Conductive Paste A | 400 × 400 | 100 | 100 | A | A | A |
| Example 17 | Undercoat Layer Solution A | Conductive Paste A | 500 × 500 | 200 | 200 | A | A | A |
| Example 18 | Undercoat Layer Solution A | Conductive Paste A | 310 × 310 | 310 | 0 | A | B | A |
| Example 19 | Undercoat Layer Solution A | Conductive Paste A | 500 × 500 | 500 | 0 | A | B | A |

Example 20

Undercoat Layer Solution A was applied by spin coating onto a glass substrate (film thickness 0.5 mm) under the conditions of 800 rpm×20 seconds, and then subjected to a heat treatment at 120° C. for 5 minutes. Undercoat Layer Solution A was again applied by spin coating under the conditions of 800 rpm×20 seconds and subjected to a heat treatment at 150° C. for 30 minutes to form Undercoat Layer A with a film thickness of 500 nm.

Next, Conductive Paste A was applied by spin coating onto Undercoat Layer A using a spin coater under the conditions of 1500 rpm for 10 seconds, and then pre-baked at 90° C. for 1 minute using a hot plate to obtain a pre-baked film with a film thickness of 300 nm. Thereafter, exposure was carried out using an exposure apparatus "PEM-8M" (trade name, manufactured by Union Optical Co., Ltd.) through a photomask having a non-opening shown in FIG. 1 as a translucent pattern, then dip development was carried out with a 0.5% KOH solution for 60 seconds, and the obtained film was rinsed with ultrapure water to obtain a pattern. The translucent pattern design of the photomask was such that the wiring portion was 10 μm×20 mm, the electrode portion was 310 μm×310 μm, the opening width of the electrode portion was 10 μm, and the non-opening was 10 μm×10 μm. The obtained pattern was irradiated with flash light (energy amount: 1 J cm$^{-2}$) using a flash lamp annealing device (PulseForge1200 (manufactured by NOVACENTRIX)). Conductivity was evaluated according to the following criteria from the surface resistance value of the conductive film after flash light irradiation.

The volume resistivity was evaluated as follows:
"A": less than 100 μΩ·cm
"B": 100 μΩ·cm or more and less than 1 mΩ·cm
"C": 1 mΩ·cm or more or unmeasurable Further, as the strength ratio of the carbon component in the obtained conductive film pattern, ratio C2/C1 of element concentration C1 of the carbon component on a surface with less carbon component among front and back surfaces of the conductive film pattern and element concentration C2 of the carbon component at a depth of 50 nm toward a central portion of the conductive film from the surface with less carbon component, using a secondary ion mass spectrometer (ADEPT-1010 (manufactured by PHI)). The results are shown in Table 4.

Example 21

In the same manner as in Example 20, the obtained pattern was irradiated with flash light (energy amount: 1.5 J cm$^{-2}$) using a flash lamp annealing device (PulseForge1200 (manufactured by NOVACENTRIX)). The obtained conductive pattern was evaluated in the same manner as in Example 20. The evaluation results are shown in Table 4.

Comparative Example 4

Undercoat Layer Solution A was applied by spin coating onto a glass substrate (film thickness 0.5 mm) under the conditions of 800 rpm×20 seconds, and then subjected to a heat treatment at 120° C. for 5 minutes. Undercoat Layer Solution A was again applied by spin coating under the conditions of 800 rpm×20 seconds and subjected to a heat treatment at 150° C. for 30 minutes to form Undercoat Layer A with a film thickness of 500 nm.

Next, Conductive Paste A was applied by spin coating onto Undercoat Layer A using a spin coater under the conditions of 1500 rpm for 10 seconds, and then pre-baked at 90° C. for 1 minute using a hot plate to obtain a pre-baked film with a film thickness of 300 nm. Thereafter, exposure was carried out using an exposure apparatus "PEM-8M" (trade name, manufactured by Union Optical Co., Ltd.) through a photomask having a non-opening shown in FIG. 1 as a translucent pattern, then dip development was carried out with a 0.5% KOH solution for 60 seconds, and the obtained film was rinsed with ultrapure water to obtain a pattern. The translucent pattern design of the photomask was such that the wiring portion was 10 μm×20 mm, the electrode portion was 310 μm×310 μm, the opening width of the electrode portion was 10 μm, and the non-opening was 10 μm×10 μm. The obtained pattern was post-baked at 230° C. for 10 minutes (in the air) using an oven ("IHPS-222"; manufactured by Espec Corp.). The obtained conductive pattern was evaluated in the same manner as in Example 18. The evaluation results are shown in Table 4.

TABLE 4

|  | Undercoat layer | Conductive paste | Volume resistivity | Carbon concentration ratio |
|---|---|---|---|---|
| Example 20 | Undercoat Layer Solution A | Conductive Paste A | A | 10.5 |
| Example 21 | Undercoat Layer Solution A | Conductive Paste A | A | 5.2 |
| Comparative Example 4 | Undercoat Layer Solution A | Conductive Paste A | C | 1.2 |

Example 22

(1) Preparation of Semiconductor Solution

To a flask containing 5 ml of chloroform, 0.10 g of poly-3-hexylthiophene (manufactured by Aldrich, regioregular, number average molecular weight (Mn): 13000, hereinafter referred to as P3HT) was added, and subjected to ultrasonic agitation in an ultrasonic washing machine (US-2 manufactured by Iuchi Seieido Ltd., output: 120 W) to obtain a chloroform solution of P3HT. Next, this solution was taken in a dropper, and delivered by 0.5 ml drops into a mixed solution of 20 ml of methanol and 10 ml of 0.1 N hydrochloric acid for reprecipitation. The solidified P3HT was collected by filtration through a membrane filter (manufactured by PTFE: tetrafluoroethylene) of 0.1 μm in pore size, and rinsed well with methanol, and then the solvent was removed by vacuum drying. Further dissolution and reprecipitation were carried out one more time to obtain a 90 mg reprecipitation P3HT.

Next, 1.5 mg of CNT1 (manufactured by CNI, single-walled CNT, purity: 95%) and 1.5 mg of the P3HT were added into 15 ml of chloroform, and subjected to, while cooling with ice, ultrasonic agitation, at an output of 250 W for 30 minutes with the use of an ultrasonic homogenizer (VCX-500 manufactured by TOKYO RIKAKIKAI CO, LTD). When ultrasonic irradiation was carried out for 30 minutes, the irradiation was stopped once, 1.5 mg of the P3HT was added, and ultrasonic irradiation was further carried out for 1 minute, thereby obtaining a CNT dispersion A (CNT composite concentration with respect to the solvent: 0.1 g/l).

Next, a semiconductor solution for forming the semiconductor layer 17 was prepared. The CNT dispersion A was subjected to filtration with the use of a membrane filter (pore size: 10 μm, diameter: 25 mm, omnipore membrane manufactured by Millipore Corporation) to remove the CNT composite of 10 μm or more in length. To 5 ml of the obtained filtrate, 45 ml of dichlorobenzene was added to give a semiconductor solution A (CNT composite concentration with respect to the solvent: 0.01 g/l).

(2) Preparation of Insulating Layer Material

In 203.36 g of propylene glycol monobutyl ether (boiling point: 170° C.), 61.29 g (0.45 mol) of methyltrimethoxysilane (hereinafter, referred to as MTMSi), 12.31 g (0.05 mol) of β-(3,4-epoxycyclohexyl)ethyltrimethoxysilane (hereinafter, referred to as β-EpETMSi), and 99.15 g (0.5 mol) of phenyltrimethoxysilane (hereinafter, referred to as PhTMSi) were dissolved, and 54.90 g of water and 0.864 g of phosphoric acid were added thereto with stirring. The obtained solution was heated at a bath temperature of 105° C. for 2 hours to raise the internal temperature up to 90° C., thereby distilling off a component mainly composed of methanol as a by-product. Next, the solution was heated at a bath temperature of 130° C. for 2.0 hours to raise the internal temperature up to 118° C., thereby distilling off a component mainly composed of water and propylene glycol monobutyl ether, and then cooled to room temperature to obtain an insulating layer material A with a solid content concentration of 26.0% by mass.

The obtained insulating layer material A was weighed for 50 g, mixed with 16.6 g of propylene glycol monobutyl ether (boiling point: 170° C., hereinafter, referred to as PGMB), and stirred for 2 hours at room temperature to obtain an insulating layer material B (solid content concentration: 19.5% by mass).

(3) Fabrication of FET

An FET was fabricated as shown in FIG. 1. Undercoat Layer Solution C was applied by spin coating onto a PET substrate (film thickness 50 μm) under the conditions of 600 rpm×10 seconds, and then subjected to a heat treatment at 120° C. for 5 minutes. Then, it was subjected to a heat treatment at 150° C. for 30 minutes to form Undercoat Layer C with a film thickness of 1 μm.

Next, Conductive Paste A was applied by spin coating onto Undercoat Layer C using a spin coater under the conditions of 1500 rpm for 10 seconds, and then pre-baked at 90° C. for 1 minute using a hot plate to obtain a pre-baked film with a film thickness of 300 nm. Thereafter, exposure was carried out using an exposure apparatus "PEM-8M" (trade name, manufactured by Union Optical Co., Ltd.) through a photomask, then dip development was carried out with a 0.5% KOH solution for 60 seconds, and the obtained film was rinsed with ultrapure water to obtain a gate pattern. The obtained pattern was irradiated with flash light in the same manner as in Example 1.

Next, the gate insulating layer material B prepared by the method described in the foregoing (2) was applied by spin coating onto the PET substrate with the gate electrode formed thereon under the conditions of 800 rpm×20 seconds, and then subjected to a heat treatment at 120° C. for 5 minutes. Then, the insulating layer material B was again applied by spin coating under the conditions of 800 rpm×20 seconds, and subjected to a heat treatment at 150° C. for 30 minutes under a nitrogen flow, thereby forming an insulating layer with a film thickness of 400 nm.

Next, Conductive Paste B was applied by spin coating onto the insulating layer using a spin coater under the conditions of 1500 rpm for 10 seconds, and then pre-baked at 90° C. for 1 minute using a hot plate to obtain a pre-baked film with a film thickness of 300 nm. Thereafter, exposure was carried out using an exposure apparatus "PEM-8M" (trade name, manufactured by Union Optical Co., Ltd.) through a photomask, then dip development was carried out with a 0.5% KOH solution for 60 seconds, and the obtained film was rinsed with ultrapure water, the obtained pattern was irradiated with flash light in the same manner as in Example 1 to prepare a source electrode and a drain electrode on the insulating layer.

Next, 400 pl of the semiconductor solution A prepared by the method described in the foregoing (1) was delivered by drops between the source electrode and the drain electrode with the use of an ink-jet apparatus (manufactured by Cluster Technology Co., Ltd.), and subjected to a heat treatment at 150° C. for 30 minutes under a nitrogen flow on a hot plate to form a semiconductor layer, thereby obtaining an FET. The spacing between the source electrode and the drain electrode was 20 μm.

With respect to the obtained FET, the mobility of the FET was evaluated by the method described in [2]. As a result, the mobility was 0.6 cm$^2$/V·sec.

Example 23

An FET was fabricated in the same manner as in Example 22 except that the insulating layer was formed using Undercoat Layer Solution B, and characteristics were measured. As a result of evaluating the mobility of the FET, the mobility was 0.4 cm$^2$/V·sec.

(Example 24)

(1) Fabrication of RFID

Undercoat Layer Solution C was applied by spin coating onto a PET substrate (film thickness 50 μm) under the conditions of 600 rpm×10 seconds and then subjected to a heat treatment at 120° C. for 5 minutes, followed by a heat treatment at 150° C. for 30 minutes, thereby forming Undercoat Layer C with a film thickness of 1 μm.

Next, Conductive Paste A was applied onto Undercoat Layer C by screen printing so that the dry film thickness was 1 μm, and the obtained coating film was pre-baked in a hot air oven at 100° C. for 1 minute. Thereafter, exposure was carried out using an exposure apparatus "PEM-8M" (trade name, manufactured by Union Optical Co., Ltd.) through a photomask, then dip development was carried out with a 0.5% KOH solution for 60·seconds, and the obtained film was rinsed with ultrapure water to obtain a pattern. The resulting pattern was irradiated with flash light in the same manner as in Example 1 to prepare an antenna pattern and a connection wiring pattern, a gate electrode, and a wiring on the substrate. Thereafter, an FET was fabricated in the same manner as in Example 22, and an RFID was fabricated.

It was confirmed that the obtained RFID had conduction on the circuit composed of the antenna and FET, and operated as an RFID.

DESCRIPTION OF REFERENCE SIGNS

1: Opening
2: Non-opening
3: Electrode
4: Wiring
5: Electrode width
6: Wiring width
7: Width of conductive film in non-opening
11: Substrate
12: First electrode
13: Undercoat layer
14: Insulating layer
15: Second electrode
16: Third electrode
17: Semiconductor layer
21: Substrate
22: First electrode
23: Undercoat layer
24: Ferroelectric layer
25: Second electrode
31: Substrate
33: Undercoat layer
34: Dielectric layer
35: First electrode
36: Second electrode
100: Substrate
101: Antenna pattern
102: Circuit
103: Connection wiring

The invention claimed is:

1. A method for producing a conductive film, comprising steps of:
 applying a conductive paste containing conductive particles surface-coated with a carbon simple substance and a photosensitive organic component onto a substrate to form a coating film; and
 irradiating the coating film with flash light,
 wherein, in the coating film, a carbon weight ratio of the carbon simple substance is 0.5% to 20% by weight ratio to the conductive particles.

2. The method for producing a conductive film according to claim 1, wherein
 the conductive film has a wiring and an electrode subjected to patterning,
 the wiring has a width of 200 μm or less in at least a part thereof,
 at least one of the wiring and the electrode has a wide portion exceeding a width of 200 μm,
 the wide portion has an opening and a non-opening, and a width of the conductive film in the non-opening is 200 μm or less.

3. The method for producing a conductive film according to claim 1, wherein an average thickness of a surface coating layer of the conductive particles surface-coated with a carbon simple substance is 0.1 to 10 nm.

4. The method for producing a conductive film according to claim 1, wherein the conductive particles are silver particles.

5. The method for producing a conductive film according to claim 1, wherein an average particle diameter of the conductive particles is 10 to 200 nm.

6. The method for producing a conductive film according to claim 1, further comprising a step of exposing and developing the coating film.

7. The method for producing a conductive film according to claim 1, wherein the substrate has an undercoat layer.

8. The method for producing a conductive film according to claim 7, wherein the undercoat layer contains at least one of an acrylic resin and a siloxane-based resin.

9. A method for producing a field effect transistor, comprising steps (1) to (4):
 (1) forming a first electrode;
 (2) forming an insulating layer;
 (3) forming a second electrode and a third electrode that are electrically insulated from the first electrode by the insulating layer; and
 (4) forming a semiconductor layer between the second electrode and the third electrode,
 wherein
 at least one of the first electrode, the second electrode, and the third electrode is formed of a conductive film, and
 the conductive film is produced using the method for producing a conductive film according to claim 1.

10. The method for producing a field effect transistor according to claim 9, wherein the step of forming a semiconductor layer includes a procedure of applying a solution containing carbon nanotubes.

11. A method for producing a wireless communication device, comprising steps of:
 forming a field effect transistor on a substrate; and
 forming an antenna on the substrate,
 wherein
 the field effect transistor is formed using the method for producing a field effect transistor according to claim 9.

12. A method for producing a wireless communication device, comprising steps of:
 forming a field effect transistor on a substrate; and
 forming an antenna on the substrate,
 wherein
 the antenna contains a conductive film, and
 the conductive film is formed using the method for producing a conductive film according to claim 1.

* * * * *